US012666786B2

(12) United States Patent
Wang et al.

(10) Patent No.: US 12,666,786 B2
(45) Date of Patent: Jun. 23, 2026

(54) LIGHT EMITTING DIODE AND DISPLAY APPARATUS

(71) Applicant: BOE Technology Group Co., Ltd., Beijing (CN)

(72) Inventors: Peng Wang, Beijing (CN); Qingyu Huang, Beijing (CN); Juan Zhang, Beijing (CN); Mengna Sun, Beijing (CN); Zhiqiang Jiao, Beijing (CN); Weijie Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 434 days.

(21) Appl. No.: 18/264,490

(22) PCT Filed: Nov. 28, 2022

(86) PCT No.: PCT/CN2022/134733
§ 371 (c)(1),
(2) Date: Aug. 7, 2023

(87) PCT Pub. No.: WO2024/113106
PCT Pub. Date: Jun. 6, 2024

(65) Prior Publication Data
US 2024/0179934 A1     May 30, 2024

(51) Int. Cl.
*H10K 50/12* (2023.01)
*H10K 50/13* (2023.01)

(52) U.S. Cl.
CPC ............. *H10K 50/13* (2023.02); *H10K 50/12* (2023.02)

(58) Field of Classification Search
CPC ........ H10K 50/13; H10K 50/12; H10K 50/11; H10K 50/165; H10K 50/166
See application file for complete search history.

(56) References Cited

U.S. PATENT DOCUMENTS

| | | | |
|---|---|---|---|
| 2003/0170491 A1* | 9/2003 | Liao ....................... | H05B 45/60 |
| | | | 257/88 |
| 2009/0284139 A1 | 11/2009 | Ushikubo et al. | |
| 2019/0333968 A1 | 10/2019 | Yamada et al. | |

FOREIGN PATENT DOCUMENTS

| | | | |
|---|---|---|---|
| CN | 102130302 A | * | 7/2011 |
| CN | 102163696 A | | 8/2011 |

(Continued)

OTHER PUBLICATIONS

English Machine Translation of Zhou et al CN 110391281 (Year: 2025).*

(Continued)

*Primary Examiner* — Donald L Raleigh
(74) *Attorney, Agent, or Firm* — Intellectual Valley Law, P.C.

(57) ABSTRACT

A light emitting diode is provided. The light emitting diode includes a light emitting layer. The light emitting layer includes one or more first layers and one or more second layers in a stacked structure. A respective first layer of the one or more first layers includes an organic functional material of a first type doped with an organic functional material of a second type. A respective second layer of the one or more second layers includes an organic functional material of the first type without being doped with an organic functional material of the second type. The light emitting layer includes one or more double-layer structure stacked on each other, a respective double-layer structure including an individual second layer and an individual first layer stacked on the individual second layer.

19 Claims, 13 Drawing Sheets

(56)     References Cited

FOREIGN PATENT DOCUMENTS

| CN | 202888248 U | 4/2013 |
| CN | 103427024 A | 12/2013 |
| CN | 103456890 A | 12/2013 |
| CN | 102931355 B | 12/2015 |
| CN | 109273614 A | 1/2019 |
| CN | 110391281 A * | 10/2019 ............ H10K 50/12 |
| CN | 111129334 A | 5/2020 |
| CN | 111477757 A | 7/2020 |
| CN | 113299844 A | 8/2021 |
| JP | 2009048893 A | 3/2009 |

OTHER PUBLICATIONS

English Machine Translation of Ma et al CN 102130302 (Year: 2025).*
International Search Report & Written Opinion mailed Jun. 20, 2023, regarding PCT/CN2022/134733.

* cited by examiner

LIGHT EMITTING DIODE AND DISPLAY APPARATUS

CROSS-REFERENCE TO RELATED APPLICATION

This application is a national stage application under 35 U.S.C. § 371 of International Application No. PCT/CN2022/134733, filed Nov. 28, 2022, the contents of which are incorporated by reference in the entirety.

TECHNICAL FIELD

The present invention relates to display technology, more particularly, to a light emitting diode and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides a light emitting diode, comprising a light emitting layer; wherein the light emitting layer comprises one or more first layers and one or more second layers in a stacked structure; a respective first layer of the one or more first layers comprises an organic functional material of a first type doped with an organic functional material of a second type; a respective second layer of the one or more second layers comprises an organic functional material of the first type without being doped with an organic functional material of the second type; wherein the light emitting layer comprises one or more double-layer structure stacked on each other, a respective double-layer structure comprising an individual second layer and an individual first layer stacked on the individual second layer.

Optionally, the light emitting layer comprises an initial layer and a last layer, which are two outmost layers on two sides of the light emitting layer; and the initial layer and the last layer of the light emitting layer are two second layers of the one or more second layers.

Optionally, two adjacent first layers of the one or more first layers are spaced apart from each other by a second layer of the one or more second layers; and two adjacent second layers of the one or more second layers are spaced apart from each other by a first layer of the one or more first layers.

Optionally, a weight percentage of the organic functional material of the second type in the one or more first layers is in the range of about 20% to about 50%.

Optionally, the light emitting diode further comprises a hole transport layer and an electron transport layer; wherein any individual first layer of the one or more first layers is spaced apart from the hole transport layer by at least one second layer of the one or more second layers; and any individual first layer of the one or more first layers is spaced apart from the electron transport layer by at least one second layer of the one or more second layers.

Optionally, the light emitting layer further comprises one or more third layers; wherein the one or more first layers, the one or more second layers, and the one or more third layers are in the stacked structure; and a respective third layer of the one or more third layers comprises an organic functional material of the second type and is absent of the organic functional material of the first type.

Optionally, the respective first layer is in direct contact with the respective second layer on one side, and in direct contact with a respective third layer on the other side; and the light emitting layer comprises one or more triple-layer structure in the stacked structure, a respective triple-layer structure of the one or more triple-layer structure comprising an individual second layer, an individual first layer stacked on the individual second layer, and an individual third layer stacked on a side of the individual first layer away from the individual second layer.

Optionally, two adjacent first layers of the one or more first layers are spaced apart from each other by a second layer of the one or more second layers or a third layer of the one or more third layers; and any individual first layer of the one or more first layers spaces apart one second layer of the one or more second layers and one third layer of the one or more third layers.

Optionally, the one or more second layers comprises at least a first respective second layer and a second respective second layer; the first respective second layer comprises a first organic functional material of the first type without being doped with an organic functional material of the second type; the second respective second layer comprises a second organic functional material of the first type without being doped with an organic functional material of the second type; the first organic functional material of the first type and the second organic functional material of the first type are both organic functional materials of the first type; and the first organic functional material of the first type is different from the second organic functional material of the first type.

Optionally, the first organic functional material of the first type is a p-type organic functional material of the first type; and the second organic functional material of the first type is an n-type organic functional material of the first type.

Optionally, wherein the second respective second layer is on a side of the first respective second layer away from the hole transport layer; and the first respective second layer is on a side of the second respective second layer away from the electron transport layer.

Optionally, the one or more first layers comprises at least a first respective first layer and a second respective first layer; the first respective first layer comprises a first organic functional material of the first type doped with an organic functional material of the second type; the second respective first layer comprises a second organic functional material of the first type doped with an organic functional material of the second type; the first organic functional material of the first type and the second organic functional material of the first type are both organic functional materials of the first type; and the first organic functional material of the first type is different from the second organic functional material of the first type.

Optionally, the first organic functional material of the first type is a p-type organic functional material of the first type; and the second organic functional material of the first type is an n-type organic functional material of the first type.

Optionally, the second respective first layer is on a side of the first respective first layer away from the hole transport layer; and the first respective first layer is on a side of the second respective first layer away from the electron transport layer.

Optionally, the one or more first layers comprises a first respective first layer, a second respective first layer, and a third respective first layer; the first respective first layer is a first layer of a first color; the second respective first layer is a first layer of a second color; and the third respective first layer is a first layer of a third color; and the first color, the second color, and the third color are three different colors.

Optionally, the one or more first layers further comprises one or more fourth respective first layers at least partially outside an exciton recombination region of the light emitting layer.

Optionally, the light emitting layer comprises a first double-layer structure comprising a first individual second layer and the first respective first layer on the first individual second layer; a second double-layer structure comprising a second individual second layer and the second respective first layer on the second individual second layer; and a third double-layer structure comprising a third individual second layer and the third respective first layer on the third individual second layer; wherein the third double-layer structure is on a side of the second double-layer structure away from the first double-layer structure; the first individual second layer, the second individual second layer, and the third individual second layer are different layers; and the first respective first layer, the second respective first layer, and the third respective first layer are different layers.

Optionally, the light emitting layer comprises a first double-layer structure comprising a first individual second layer and the fourth respective first layer on the first individual second layer; a second double-layer structure comprising a second individual second layer and the first respective first layer on the second individual second layer; a third double-layer structure comprising a third individual second layer and the second respective first layer on the third individual second layer; and a fourth double-layer structure comprising a fourth individual second layer and the third respective first layer on the fourth individual second layer, and a last layer which is one of the one or more second layers; wherein the third double-layer structure is on a side of the second double-layer structure away from the first double-layer structure, and the fourth double-layer structure is on a side of the third double-layer structure away from the second double-layer structure.

Optionally, the light emitting diode comprises a first light emitting layer; a charge generating layer on the first light emitting layer; and a second light emitting layer on a side of the charge generating layer away from the first light emitting layer; wherein the charge generating layer comprises a n-doped layer, and a p-doped layer on a side of the n-doped layer away from the first light emitting layer.

In another aspect, the present disclosure provides a display apparatus, comprising the light emitting diode described herein or fabricated by a method described herein, and a pixel driving circuit configured to drive light emission of the light emitting diode.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
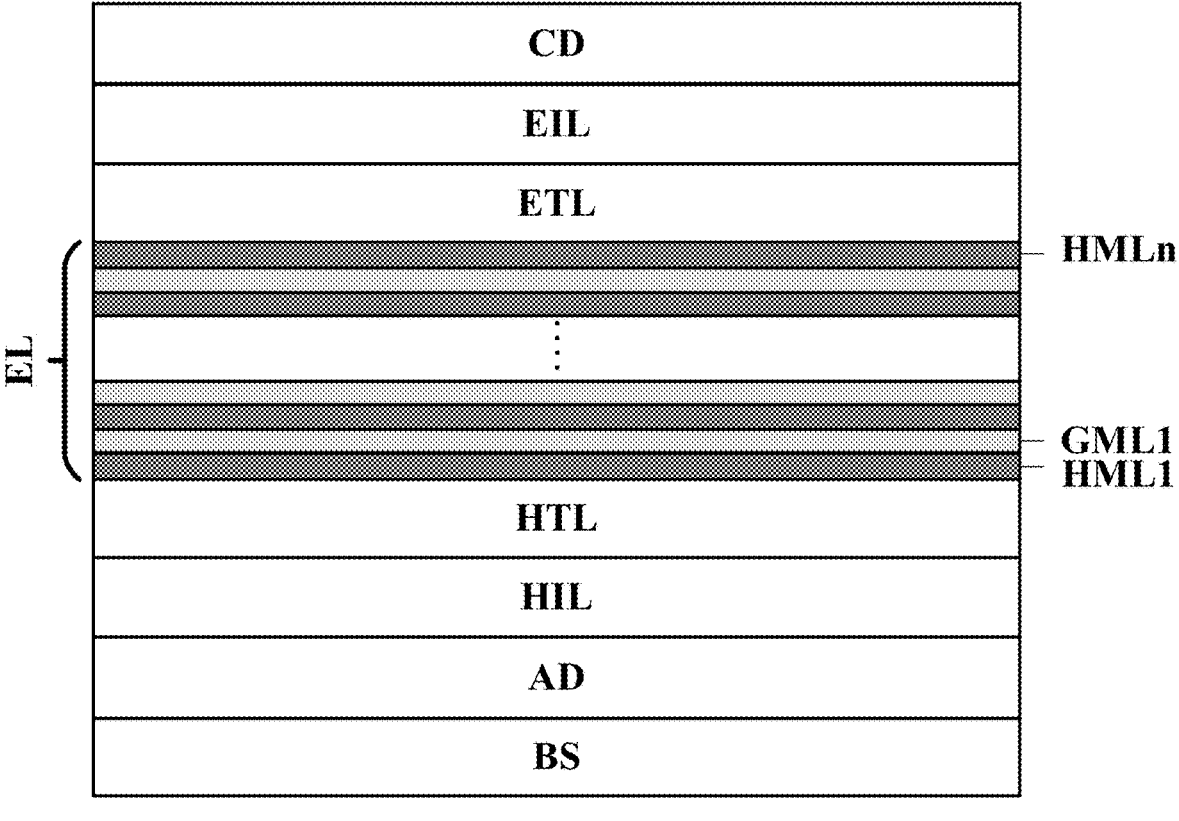
FIG. 1 is a schematic diagram illustrating the structure of a related light emitting diode.

FIG. 1 is a schematic diagram illustrating the structure of a related light emitting diode. Referring to FIG. 1, the related light emitting diode includes a base substrate BS, an anode AD on the base substrate BS, a light emitting layer EL on a side of the anode AD away from the base substrate BS, and a cathode CD on a side of the light emitting layer EL away from the base substrate BS. Optionally, the related light emitting diode further includes a hole injection layer HIL on a side of the anode AD away from the base substrate BS, a hole transport layer HTL on a side of the hole injection layer HIL away from the base substrate BS, an electron transport layer ETL on a side of the light emitting layer EL away from the base substrate BS, and an electron injection layer EIL on a side of the electron transport layer ETL away from the base substrate BS.

In the related light emitting diode, the light emitting layer EL in some embodiments includes a quantum well structure, e.g., a multiple quantum wells structure. Specifically, the light emitting layer EL in the related light emitting diode includes n number of host material layers (e.g., HML1, . . . , HMLn) and (n−1) number of guest material layers, wherein n is an integer greater than 1. In one example, (n−1) number of host material layers (e.g., HML1 to HML(n−1)) and (n−1) number of guest material layers are alternately stacked. In another example, an initial layer and a last layer of the light emitting layer EL are host material layers (e.g., HML1 and HMLn). The quantum wells confine the carrier recombination within the light emitting layer EL, enhance concentrations of electron carriers and hole carriers, and increase recombination efficiency of the carriers. However, when the concentrations of the carriers are higher than appropriate values, concentration quenching occurs and emission intensity of the light emitting layer EL actually decreases. Because concentration quenching lowers the lifetime of the device, a thickness of the guest material layers must be precisely controlled, e.g., to be less than 5 nm. This issue makes the fabrication of the related light emitting diode highly complicated, leading to non-uniformity in mass production.

Accordingly, the present disclosure provides, inter alia, a light emitting diode and a display apparatus that substantially obviate one or more of the problems due to limitations and disadvantages of the related art. In one aspect, the present disclosure provides a light emitting diode. In some embodiments, the light emitting diode includes a light emitting layer. Optionally, the light emitting layer includes one or more first layers and one or more second layers in a stacked structure. Optionally, a respective first layer of the one or more first layers comprises an organic functional material of a first type doped with an organic functional material of a second type. Optionally, a respective second layer of the one or more second layers comprises an organic functional material of the first type without being doped with an organic functional material of the second type. Optionally, the light emitting layer comprises one or more double-layer structure stacked on each other, a respective double-layer structure comprising an individual second layer and an individual first layer stacked on the individual second layer.

Figure 2:
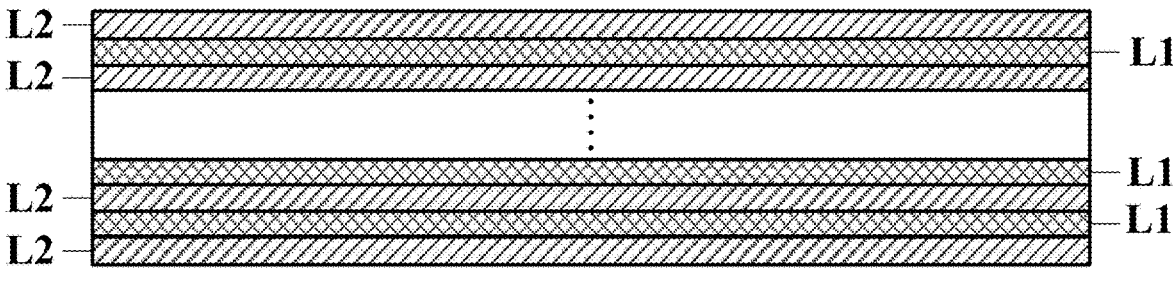
FIG. 2 is a schematic diagram illustrating the structure of a light emitting layer in some embodiments according to the present disclosure.

FIG. 2 is a schematic diagram illustrating the structure of a light emitting layer in some embodiments according to the present disclosure. Referring to FIG. 2, the light emitting layer in some embodiments includes one or more first layers and one or more second layers stacked together. In some embodiments, a respective first layer of the one or more first layers includes an organic functional material of a first type (e.g., a host material) doped with an organic functional material of a second type (e.g., a guest material), a respective second layer of the one or more second layers includes an organic functional material of the first type without being doped with an organic functional material of the second type, e.g., the organic functional material of the second type is absent in the respective second layer. In one example, the respective first layer includes a host material doped with a guest material, and the respective second layer includes a host material without being doped with a guest material. In FIG. 2, the one or more first layers are denoted as L1, and the one or more second layers are denoted as L2. The dotted line in FIG. 2 denotes that the alternately stacked respective first layer and respective second layer may be repeated for one or more times.

In one example, organic functional materials of the first type in the one or more first layers L1 are the same. In another example, organic functional materials of the first type in at least two of the one or more first layers L1 are different.

In one example, organic functional materials of the second type in the one or more first layers L1 are the same. In another example, organic functional materials of the second type in at least two of the one or more first layers L1 are different.

In one example, organic functional materials of the first type in the one or more second layers L2 are the same. In another example, organic functional materials of the first type in at least two of the one or more second layers L2 are different.

In one example, organic functional materials of the first type in the respective first layer and the respective second layer are the same. In another example, organic functional materials of the first type in the respective first layer and the respective second layer are different.

As used herein, the term "guest material" refers to a material that is capable of changing electronic characteristics or emission wavelength of a layer compared to electronic characteristics or emission wavelength of the layer in the absence of the guest material. As used herein, the term "host material" is a material to which a guest material may or may not be added. The host material may or may not have the ability to emit light in the absence of the guest material.

In some embodiments, the light emitting layer includes one or more double-layer structure stacked on each other, a respective double-layer structure comprising an individual second layer and an individual first layer stacked on the individual second layer. To illustrate, in one example, the light emitting layer includes $(iL2–iL1)_m$, wherein iL2 stands for an individual second layer of the one or more second layers L2, iL1 stands for an individual first layer of the one or more first layers L1, m is an integer equal to or greater than 1, e.g., 1, 2, 3, 4, 5, 6, 7, 8, 9, or 10.

In some embodiments, the light emitting layer includes an initial layer and a last layer, which are two outmost layers on two sides of the light emitting layer. Optionally, the initial layer and the last layer of the light emitting layer are two second layers of the one or more second layers L2. To illustrate, in one example, the light emitting layer includes $(iL2-iL1)_m-iL2$ wherein iL2 stands for an individual second layer of the one or more second layers L2, iL1 stands for an individual first layer of the one or more first layers L1, m is an integer equal to or greater than 1, e.g., 1, 2, 3, 4, 5, 6, 7, 8, 9, or 10.

In some embodiments, two adjacent first layers of the one or more first layers L1 are spaced apart from each other by a second layer of the one or more second layers L2. In some embodiments, two adjacent second layers of the one or more second layers L2 are spaced apart from each other by a first layer of the one or more first layers L1.

In some embodiments, a weight percentage of the organic functional material of the first type (e.g., the host material) in the one or more first layers L1 is in the range of about 40% to about 99% (e.g., 40% to 50%, 50% to 60%, 60% to 70%, 70% to 80%, 80% to 90%, 90% to 95%, or 95% to 100%), and a weight percentage of the organic functional material of the second type (e.g., the guest material) in the one or more first layers L1 is in the range of about 1% to about 60% (e.g., 1% to 5%, 5% to 10%, 10% to 20%, 20% to 30%, 30% to 40%, 40% to 50%, or 50% to 60%). In the present disclosure, any two adjacent first layers of the one or more first layers L1 are spaced apart from each other by a second layer of the one or more second layers L2, the issue of concentration quenching can be obviated. The doping concentration can be much higher without having the issue of concentration quenching. In one example, the weight percentage of the organic functional material of the second type (e.g., the guest material) in the one or more first layers L1 is in the range of about 20% to about 50%.

In some embodiments, the respective first layer and/or the respective second layer can be made to have a greater thickness than those in the related light emitting diodes. In the related light emitting diodes, a discrete guest material layer is present, in which exciton concentration is relatively high. Thus, in the related light emitting diodes, the guest material layer is typically required to be ultra-thin, e.g., less than 5 nm. In the present disclosure, the light emitting diode lacks a discrete guest material layer. The exciton concentration in the one or more first layers L1 is relatively lower, obviating the concentration quenching issue. Accordingly, the one or more first layers L1 and the one or more second layers L2 in the present disclosure can be made to have relatively large thickness, e.g., greater than 5 nm. This leads to a relatively simple fabrication process and enhanced uniformity in mass production as compared to the related light emitting diodes. Moreover, the inventors of the present disclosure discover that a superior light emission efficiency and device life-time can be achieved by a combination of several factors including values of n and m, weight percentages of the host material and the guest material, and thicknesses of the first layers and the second layers.

Various appropriate organic functional materials of the first type (e.g., host materials) may be used in the present disclosure. Examples of organic functional materials of the first type include 3-tert-Butyl-9,10-di(naphth-2-yl)anthracene, 9,10-Di(1-naphthyl)anthracene, 4,4'-Bis(2,2-diphenylvinyl)-1,1'-biphenyl, 1,3,6,8-Tetraphenylpyrene, 9,9'-spirobifluorene, 4,4'-Bis(N-carbazolyl)-1,1'-biphenyl, 3,3'-Bis(N-carbazolyl)-1,1'-biphenyl. Optionally, the guest material is selected from a group consisting of 2,5,8,11-Tetra-tert-butylperylene, BCzVBi, and 4,4'-[1,4-phenylenedi-(1E)-2,1-ethenediyl]bis[N,N-diphenylbenzenamine].

In some embodiments, the organic functional material of the first type is a bipolar host material. As used herein, the term bipolar host material refers to a host material which possesses both hole and electron transport properties. Examples of bipolar host materials include 4,4'-Bis(N-carbazolyl)-1,1'-biphenyl, 2,9-Bis(naphthalen-2-yl)-4,7-diphenyl-1,10-phenanthroline, and 1,3-N,N-dicarbazole-benzene.

Various appropriate organic functional materials of the second type (e.g., guest materials) may be used in the present disclosure. Examples of organic functional materials of the second type include 2,5,8,11-Tetra-tert-butylperylene, BCzVBi, 4,4'-[1,4-phenylenedi-(1E)-2,1-ethenediyl]bis[N,N-diphenylbenzenamine].

In some embodiments, the organic functional material of the second type is a guest material having a high emission efficiency. Examples of guest materials having high emission efficiencies include 8-tris-hydroxyquinoline aluminum, tris(2-phenylpyridine)-iridium, tris(1-phenylisoquinoline)iridium(III), and bis[2-(4,6-difluorophenyl)pyridinato-C2,N](picolinato)iridium(III).

Figure 3:
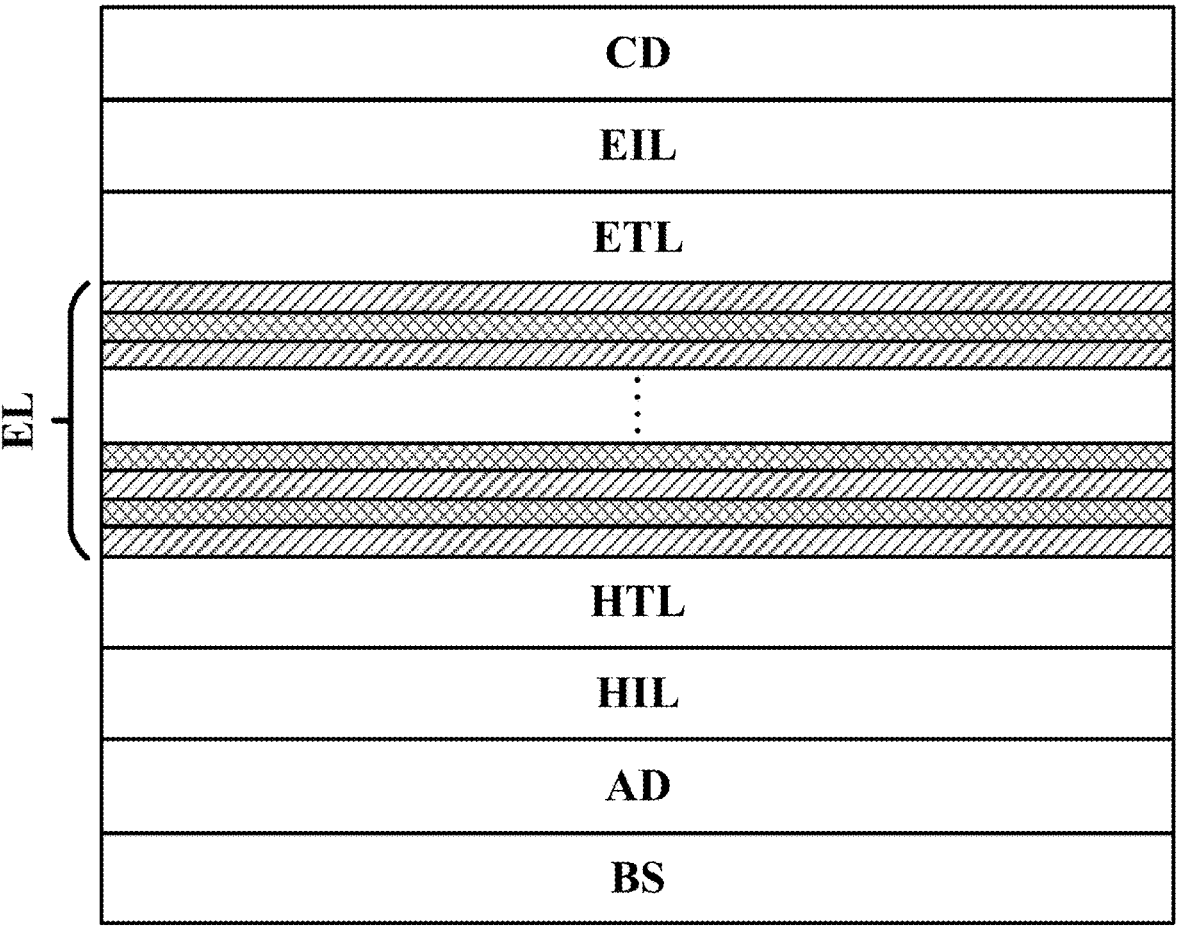
FIG. 3 is a schematic diagram illustrating the structure of a light emitting diode in some embodiments according to the present disclosure.

FIG. 3 is a schematic diagram illustrating the structure of a light emitting diode in some embodiments according to the present disclosure. Referring to FIG. 3, the light emitting diode in some embodiments includes a base substrate BS, an anode AD on the base substrate BS, a hole injection layer HIL on a side of the anode AD away from the base substrate BS, a hole transport layer HTL on a side of the hole injection layer HIL away from the base substrate BS, a light emitting layer EL on a side of the hole transport layer HTL away from the base substrate BS, an electron transport layer ETL on a side of the light emitting layer EL away from the base substrate BS, an electron injection layer EIL on a side of the electron transport layer ETL away from the base substrate BS, and a cathode CD on a side of the electron injection layer EIL away from the base substrate BS.

In some embodiments, referring to FIG. 2 and FIG. 3, any individual first layer of the one or more first layers L1 is spaced apart from the hole transport layer HTL or the hole injection layer HIL by at least one second layer of the one or more second layers L2. Any individual first layer of the one or more first layers L1 is not in direct contact with the hole transport layer HTL or the hole injection layer HIL. This structure avoids any undesirable recombination at an interface between an individual first layer and the hole transport layer HTL.

In some embodiments, referring to FIG. 2 and FIG. 3, any individual first layer of the one or more first layers L1 is spaced apart from the electron transport layer ETL or the electron injection layer EIL by at least one second layer of the one or more second layers L2. Any individual first layer of the one or more first layers L1 is not in direct contact with the electron transport layer ETL or the electron injection layer EIL. This structure avoids any undesirable recombination at an interface between an individual first layer and the electron transport layer ETL.

Various appropriate hole transport materials may be used for making the hole transport layer HTL. Examples of appropriate hole transport materials include, but are not limited to, various p-type polymer materials and various p-type low-molecular-weight materials, e.g., polythiophene, polyaniline, polypyrrole, and a mixture having poly-3,4-ethylenedioxythiophene and poly(sodium-p-styrenesulfonate), 4,4'-cyclohexylidene bis[N,N-bis(4-methylphenyl)benzenamine (TAPC), 4,4',4"-tris(N-carbazolyl)triphenylamine (TCTA), N,N'-di(1-naphthyl)-N,N'-diphenylbenzidine (NPB), or any combination thereof.

Various appropriate hole injection materials may be used for making the hole injection layer HIL. Examples of appropriate hole injection materials include, but are not limited to, poly(3,4-ethylenedioxythiophene) polystyrene sulfonate (PEDOT:PSS), polythiophene, polyaniline, polypyrrole, copper phthalocyanine, 4,4',4"-tris(N,N-phenyl-3-methylphenylamino)triphenylamine (m-MTDATA), MoO3, and CuPc.

Various appropriate electron injection materials may be used for making the electron injection layer EIL. Examples of appropriate electron injection materials include, but are not limited to, lithium fluoride and 8-hydroxyquinoline lithium.

Various appropriate electron transport materials may be used to make the electron transport layer ETL. Examples of appropriate electron transport materials include, but are not limited to, 4,7,-diphenyl-1,10-phenanthroline, 2,9-Bis(naphthalen-2-yl)-4,7-diphenyl-1,10-phenanthroline, 2,9-dimethyl-4,7-diphenyl-1,10-phenanthroline, 8-hydroxyquinoline aluminum, 8-hydroxyquinoline lithium, Bis(8-hydroxy-2-methylquinoline)-(4-phenylphenoxy)aluminum, tris(8-quinolinolate)aluminum, 3-(biphenyl-4-yl)-5-(4-tertbutylphenyl)-4-phenyl-4H-1,2,4-triazole, bis(10-hydroxybenzo[h]quinolinato beryllium), and 1,3,5-tris(N-phenylbenzimiazole-2-yl)benzene.

Various appropriate electrode materials and various appropriate fabricating methods may be used for forming the anode AD. Optionally, the anode AD is a transparent anode. For example, a non-metal transparent electrode material may be deposited on the substrate by a plasma-enhanced chemical vapor deposition (PECVD) process. Examples of appropriate non-metal transparent electrode materials include, but are not limited to, various transparent metal oxide electrode materials and transparent nano-carbon tubes. Examples of transparent metal oxide materials include, but are not limited to, indium tin oxide, indium zinc oxide, indium gallium oxide, and indium gallium zinc oxide.

Various appropriate metal electrode materials and various appropriate fabricating methods may be used to make the cathode CD. For example, a metal electrode material may be deposited on the substrate by a plasma-enhanced chemical vapor deposition (PECVD) process. Examples of appropriate metal electrode materials include, but are not limited to, a metal material and a graphene electrode material. Examples of appropriate metal electrode materials include, but are not limited to, gold, silver, copper, aluminum, magnesium, molybdenum, chromium, neodymium, nickel, manganese, titanium, tantalum, and tungsten.

Figure 4:
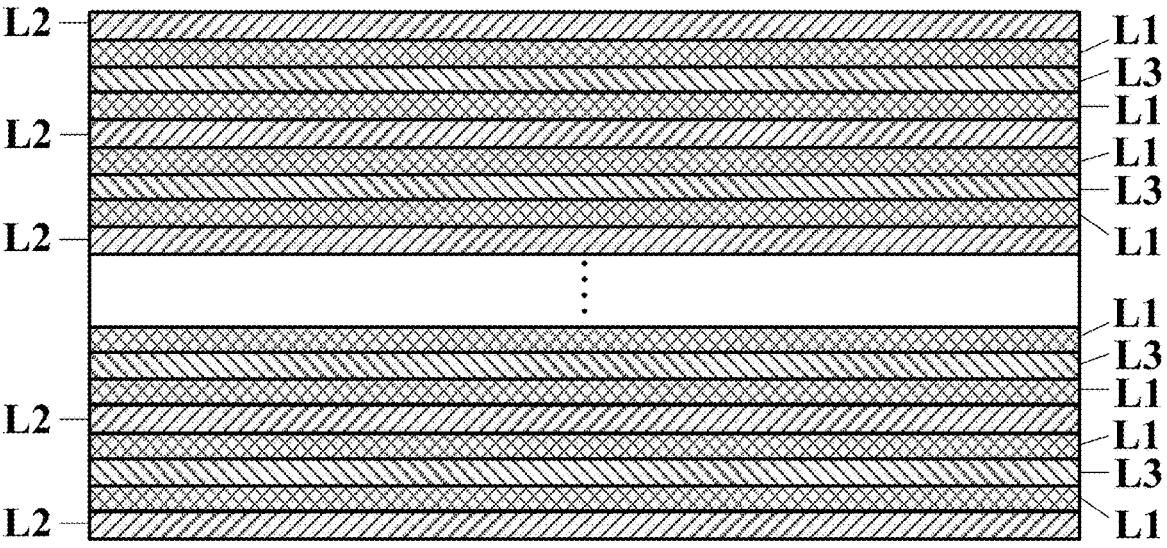
FIG. 4 is a schematic diagram illustrating the structure of a light emitting layer in some embodiments according to the present disclosure.

FIG. 4 is a schematic diagram illustrating the structure of a light emitting layer in some embodiments according to the present disclosure. Referring to FIG. 4, the light emitting layer in some embodiments further includes one or more third layers L3. For example, the light emitting layer in some embodiments includes one or more first layers, one or more second layers, and one or more third layers L3 stacked together. In some embodiments, a respective first layer of the one or more first layers L1 includes an organic functional material of a first type (e.g., a host material) doped with an organic functional material of a second type (e.g., a guest material), a respective second layer of the one or more second layers L2 includes an organic functional material of the first type without being doped with an organic functional material of the second type (e.g., the organic functional material of the second type is absent in the respective second layer), and a respective third layer of the one or more third layers L3 includes an organic functional material of the second type and is absent of the organic functional material of the first type (e.g., the host material). In one example, the respective first layer includes a host material doped with a guest material, the respective second layer includes a host material without being doped with a guest material, and the respective third layer includes a guest material without having a host material. The dotted line in FIG. 4 denotes that the alternately stacked respective first layer, respective second layer, and respective third layer may be repeated for one or more times.

In some embodiments, a respective first layer is adjacent to a respective second layer on one side, and adjacent to a respective third layer on the other side. In some embodiments, the respective first layer is in direct contact with the respective second layer on one side, and in direct contact with a respective third layer on the other side. The light emitting layer includes a stacked structure comprising the respective second layer, the respective first layer on the respective second layer, and the respective third layer on a side of the respective first layer away from the respective second layer.

In one example, organic functional materials of the first type in the one or more first layers L1 are the same. In another example, organic functional materials of the first type in at least two of the one or more first layers L1 are different.

In one example, organic functional materials of the second type in the one or more first layers L1 are the same. In another example, organic functional materials of the second type in at least two of the one or more first layers L1 are different.

In one example, organic functional materials of the first type in the one or more second layers L2 are the same. In another example, organic functional materials of the first type in at least two of the one or more second layers L2 are different.

In one example, organic functional materials of the second type in the one or more third layers L3 are the same. In another example, organic functional materials of the second type in at least two of the one or more third layers L3 are different.

In one example, organic functional materials of the first type in the respective first layer and the respective second layer are the same. In another example, organic functional materials of the first type in the respective first layer and the respective second layer are different.

In one example, organic functional materials of the second type in the respective first layer and the respective third layer are the same. In another example, organic functional materials of the second type in the respective first layer and the respective third layer are different.

In some embodiments, the light emitting layer includes one or more triple-layer structure stacked on each other, a respective triple-layer structure comprising an individual second layer, an individual first layer stacked on the individual second layer, and an individual third layer stacked on a side of the individual first layer away from the individual second layer. To illustrate, in one example, the light emitting layer includes $(iL2\text{-}iL1\text{-}iL3)_m$, wherein iL2 stands for an individual second layer of the one or more second layers L2, iL1 stands for an individual first layer of the one or more first layers L1, iL3 stands for an individual third layer of the one or more third layers L3, m is an integer equal to or greater than 1, e.g., 1, 2, 3, 4, 5, 6, 7, 8, 9, or 10.

In some embodiments, the light emitting layer includes an initial layer and a last layer, which are two outmost layers on two sides of the light emitting layer. Optionally, the initial layer and the last layer of the light emitting layer are two second layers of the one or more second layers L2. To illustrate, in one example, the light emitting layer includes $(iL2\text{-}iL1\text{-}iL3)_m\text{-}iL2$ wherein iL2 stands for an individual second layer of the one or more second layers L2, iL1 stands for an individual first layer of the one or more first layers L1, iL3 stands for an individual third layer of the one or more third layers L3, m is an integer equal to or greater than 1, e.g., 1, 2, 3, 4, 5, 6, 7, 8, 9, or 10.

In some embodiments, two adjacent first layers of the one or more first layers L1 are spaced apart from each other by a second layer of the one or more second layers L2 or a third layer of the one or more third layers L3. In some embodiments, an individual first layer of the one or more first layers L1 spaces apart an individual second layer of the one or more second layers L2 and an individual third layer of the one or more third layers L3. Optionally, any individual first layer of the one or more first layers spaces apart one second layer of the one or more second layers and one third layer of the one or more third layers.

In some embodiments, a weight percentage of the organic functional material of the first type (e.g., the host material) in the one or more first layers L1 is in the range of about 40% to about 99% (e.g., 40% to 50%, 50% to 60%, 60% to 70%, 70% to 80%, 80% to 90%, 90% to 95%, or 95% to 100%), and a weight percentage of the organic functional material of the second type (e.g., the guest material) in the one or more first layers L1 is in the range of about 1% to about 60% (e.g., 1% to 5%, 5% to 10%, 10% to 20%, 20% to 30%, 30% to 40%, 40% to 50%, or 50% to 60%). In the present disclosure, any two adjacent first layers of the one or more first layers L1 are spaced apart from each other by a second layer of the one or more second layers L2 or a third layer of the one or more third layers L3, the issue of concentration quenching can be obviated. The doping concentration can be much higher without having the issue of concentration quenching. In one example, the weight percentage of the organic functional material of the second type (e.g., the guest material) in the one or more first layers L1 is in the range of about 20% to about 50%.

In some embodiments, the respective first layer and/or the respective second layer can be made to have a greater thickness than those in the related light emitting diodes. In the related light emitting diodes, a discrete guest material layer is present, in which exciton concentration is relatively high. Thus, in the related light emitting diodes, the guest material layer is typically required to be ultra-thin, e.g., less than 5 nm.

The inventors of the present disclosure discover that, by having the individual first layer of the one or more first layers L1 spacing apart the individual second layer of the one or more second layers L2 (host) and the individual third layer of the one or more third layers L3 (guest), an energy gap of the carriers moving from the individual second layer to the individual third layer or moving from the individual third layer to the individual second layer can be reduced, making carrier transport through the light emitting layer more smooth, thereby enhancing light emission intensity and efficiency of the light emitting diode. As compared to the related light emitting layers and related light emitting diodes, the light emitting diode having a light emitting layer according to the present disclosure has a larger exciton recombination region, due to the presence of the individual first layer between the individual second layer (host) and the individual third layer (guest). In the light emitting diode according to the present disclosure, exciton concentration in the light emitting layer is reduced, avoiding occurrence of concentration quenching and achieving a higher light emission efficiency and device life-time.

Figure 5:
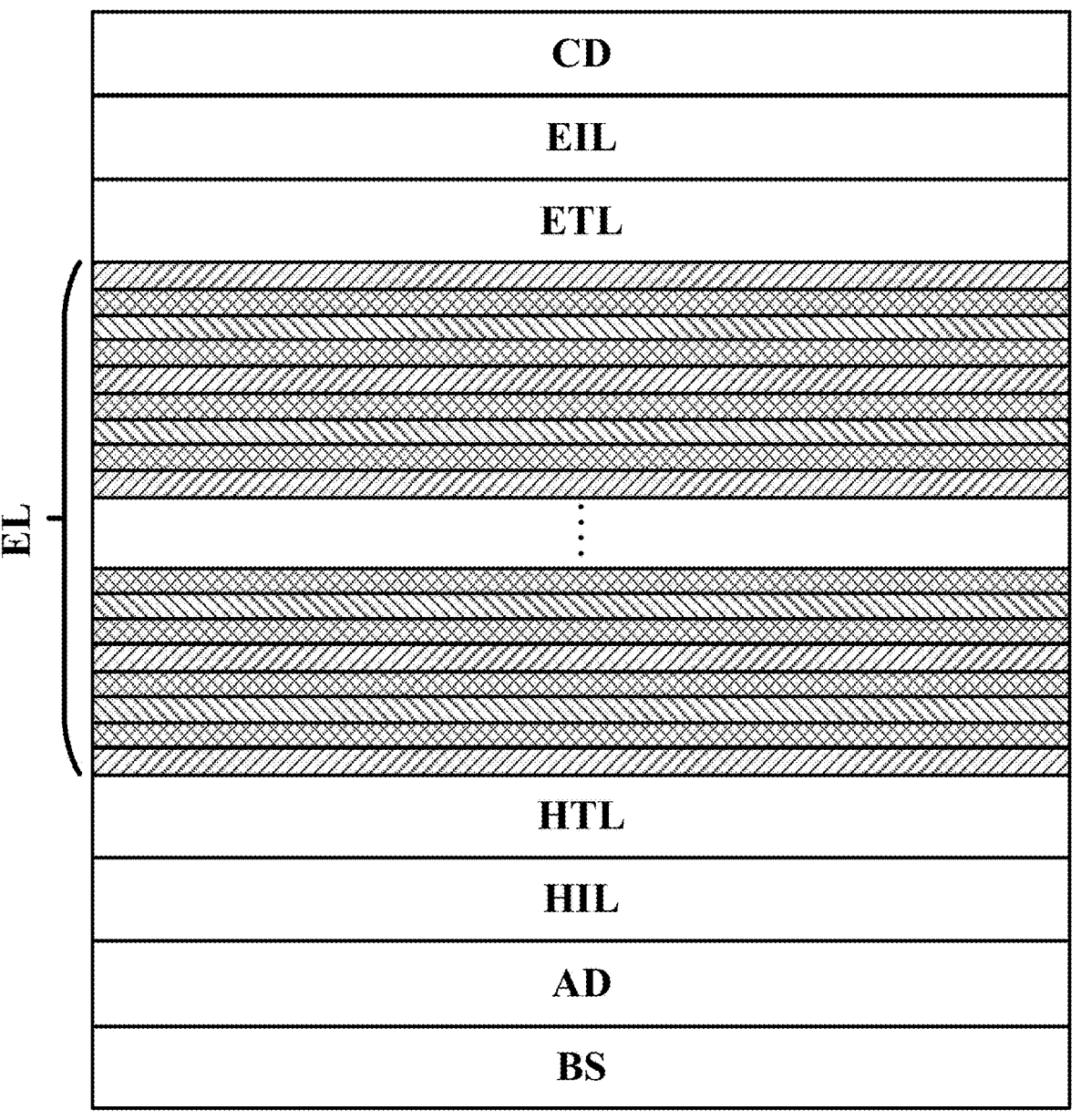
FIG. 5 is a schematic diagram illustrating the structure of a light emitting diode in some embodiments according to the present disclosure.

FIG. 5 is a schematic diagram illustrating the structure of a light emitting diode in some embodiments according to the present disclosure. Referring to FIG. 5, the light emitting diode in some embodiments includes a base substrate BS, an anode AD on the base substrate BS, a hole injection layer HIL on a side of the anode AD away from the base substrate BS, a hole transport layer HTL on a side of the hole injection layer HIL away from the base substrate BS, a light emitting layer EL on a side of the hole transport layer HTL away from the base substrate BS, an electron transport layer ETL on a side of the light emitting layer EL away from the base substrate BS, an electron injection layer EIL on a side of the electron transport layer ETL away from the base substrate BS, and a cathode CD on a side of the electron injection layer EIL away from the base substrate BS.

In some embodiments, referring to FIG. 4 and FIG. 5, any individual first layer of the one or more first layers L1 is spaced apart from the hole transport layer HTL or the hole injection layer HIL by at least one second layer of the one or more second layers L2. Any individual first layer of the one or more first layers L1 is not in direct contact with the hole transport layer HTL or the hole injection layer HIL.

This structure avoids any undesirable recombination at an interface between an individual first layer and the hole transport layer HTL.

In some embodiments, referring to FIG. 4 and FIG. 5, any individual first layer of the one or more first layers L1 is spaced apart from the electron transport layer ETL or the electron injection layer EIL by at least one second layer of the one or more second layers L2. Any individual first layer of the one or more first layers L1 is not in direct contact with the electron transport layer ETL or the electron injection layer EIL. This structure avoids any undesirable recombination at an interface between an individual first layer and the electron transport layer ETL.

Figures 6, 7:
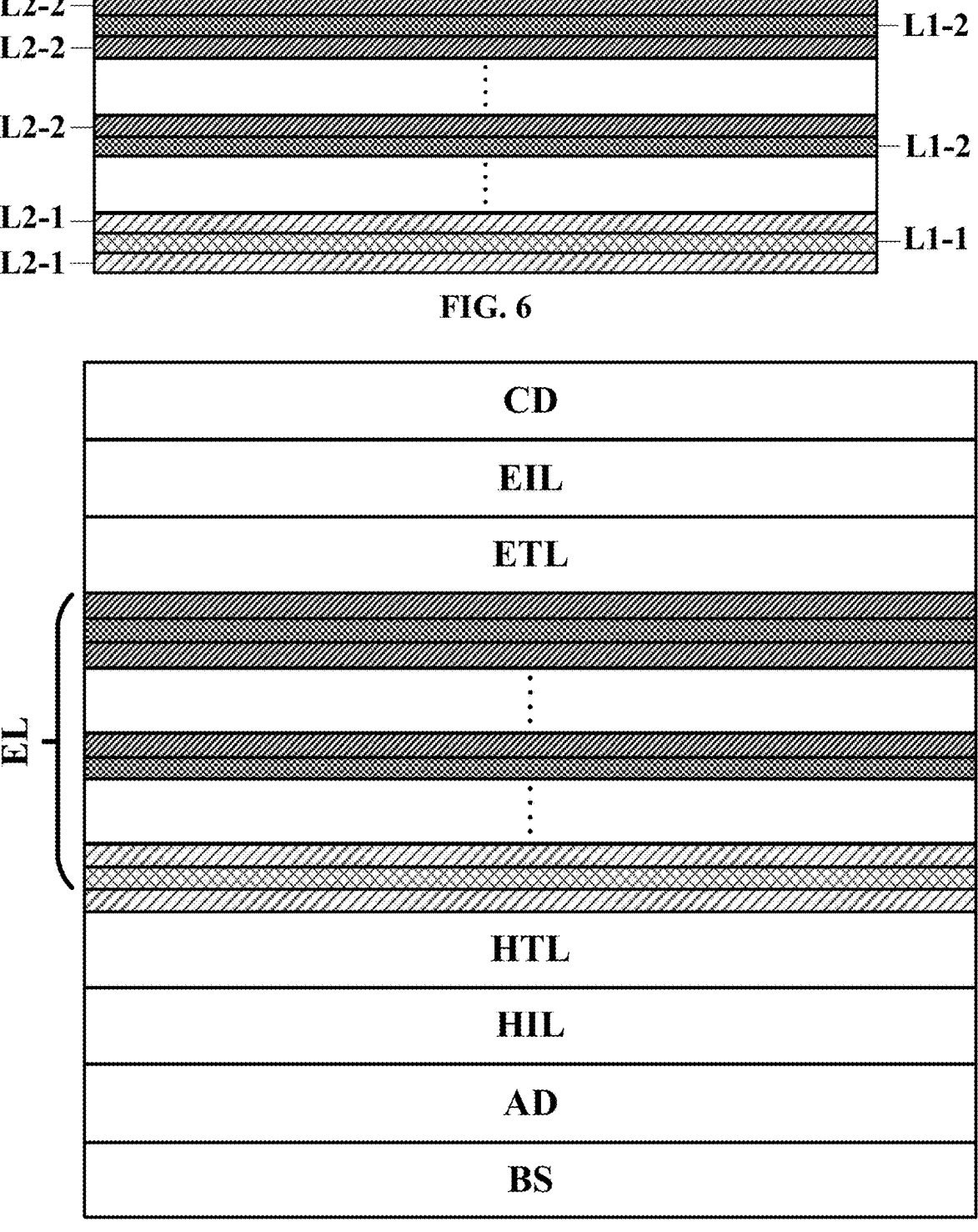
FIG. 6 is a schematic diagram illustrating the structure of a light emitting layer in some embodiments according to the present disclosure.
FIG. 7 is a schematic diagram illustrating the structure of a light emitting diode in some embodiments according to the present disclosure.

FIG. 6 is a schematic diagram illustrating the structure of a light emitting layer in some embodiments according to the present disclosure. FIG. 7 is a schematic diagram illustrating the structure of a light emitting diode in some embodiments according to the present disclosure. Referring to FIG. 6 and FIG. 7, the light emitting layer in some embodiments includes one or more first layers and one or more second layers stacked together. In some embodiments, a respective first layer of the one or more first layers includes an organic functional material of a first type (e.g., a host material) doped with an organic functional material of a second type (e.g., a guest material), a respective second layer of the one or more second layers includes an organic functional material of the first type without being doped with an organic functional material of the second type, e.g., the organic functional material of the second type is absent in the respective second layer. In one example, the respective first layer includes a host material doped with a guest material, and the respective second layer includes a host material without being doped with a guest material.

The light emitting layer and the light emitting diode depicted in FIG. 6 and FIG. 7 differ from those depicted in FIG. 2 and FIG. 3 in that, in the light emitting layer and the light emitting diode depicted in FIG. 6 and FIG. 7, the one or more second layers include at least a first respective second layer L2-1 and a second respective second layer L2-2. The first respective second layer L2-1 includes a first organic functional material of the first type without being doped with an organic functional material of the second type. The second respective second layer L2-2 includes a second organic functional material of the first type without being doped with an organic functional material of the second type. The first organic functional material of the first type and the second organic functional material of the first type are both organic functional materials of the first type. The first organic functional material of the first type is different from the second organic functional material of the first type.

In one example, the first organic functional material of the first type is a p-type organic functional material of the first type (e.g., a p-type host material), and the second organic functional material of the first type is an n-type organic functional material of the first type (e.g., an n-type host material). The term "p-type material" refers to a material having more positive carriers (holes) than negative carriers (electrons). The term "n-type material" refers to a material having more negative carriers (electrons) than positive carriers (holes).

In some embodiments, the second respective second layer L2-2 is on a side of the first respective second layer L2-1 away from the hole transport layer HTL; and the first respective second layer L2-1 is on a side of the second respective second layer L2-2 away from the electron transport layer ETL.

The inventor of the present disclosure discover that hole carriers and electron carriers have different mobility rates. Typically, the hole carriers have a mobility rate higher than the mobility rate of the electron carriers. The different mobility rates affect carrier balance, resulting in a lower exciton recombination efficiency. The inventors of the present disclosure discover that a more balanced carrier transport can be achieved by having the first respective second layer L2-1 comprising the first organic functional material of the first type and the second respective second layer L2-2 comprising the second organic functional material of the first type, the second respective second layer L2-2 being on a side of the first respective second layer L2-1 away from the hole transport layer HTL, the first respective second layer L2-1 being on a side of the second respective second layer L2-2 away from the electron transport layer ETL.

In some embodiments, in the light emitting layer and the light emitting diode depicted in FIG. 6 and FIG. 7, the one or more first layers include at least a first respective first layer L1-1 and a second respective first layer L1-2. The first respective first layer L1-1 includes a first organic functional material of the first type doped with an organic functional material of the second type. The second respective first layer L1-2 includes a second organic functional material of the first type doped with an organic functional material of the second type. The first organic functional material of the first type and the second organic functional material of the first type are both organic functional materials of the first type. The first organic functional material of the first type is different from the second organic functional material of the first type.

In one example, the first organic functional material of the first type is a p-type organic functional material of the first type (e.g., a p-type host material), and the second organic functional material of the first type is an n-type organic functional material of the first type (e.g., an n-type host material).

In some embodiments, the second respective first layer L1-2 is on a side of the first respective first layer L1-1 away from the hole transport layer HTL; and the first respective first layer L1-1 is on a side of the second respective first layer L1-2 away from the electron transport layer ETL.

In some embodiments, the light emitting layer includes one or more double-layer structure stacked on each other, a respective double-layer structure comprising an individual second layer and an individual first layer stacked on the individual second layer. To illustrate, in one example, the light emitting layer includes $(iL2\text{-}iL1)_m$, wherein iL2 stands for an individual second layer of the one or more second layers L2, iL1 stands for an individual first layer of the one or more first layers L1, m is an integer equal to or greater than 1, e.g., 1, 2, 3, 4, 5, 6, 7, 8, 9, or 10.

In some embodiments, the light emitting layer includes an initial layer and a last layer, which are two outmost layers on two sides of the light emitting layer. Optionally, the initial layer and the last layer of the light emitting layer are two second layers of the one or more second layers L2. To illustrate, in one example, the light emitting layer includes $(iL2\text{-}iL1)_m\text{-}iL2$ wherein iL2 stands for an individual second layer of the one or more second layers L2, iL1 stands for an individual first layer of the one or more first layers L1, m is an integer equal to or greater than 1, e.g., 1, 2, 3, 4, 5, 6, 7, 8, 9, or 10.

In some embodiments, m is an integer equal to or greater than 2. The light emitting layer includes $(iL2\text{-}1\text{-}iL1\text{-}1)\text{-}(iL2\text{-}iL1)_{(m\text{-}1)}\text{-}iL2\text{-}2$, wherein iL2 stands for an individual second layer of the one or more second layers L2, iL1 stands for an individual first layer of the one or more first layers L1, iL2-1 stands for an individual first respective second layer, iL2-2 stands for an individual second respective second layer, m is an integer equal to or greater than 2. Optionally, the $-(iL2\text{-}iL1)_{(m\text{-}1)}\text{-}$ may further include one or more additional first respective second layer, and/or one or more additional second respective second layer.

In some embodiments, two adjacent first layers of the one or more first layers L1 are spaced apart from each other by a second layer of the one or more second layers L2. In some embodiments, two adjacent second layers of the one or more second layers L2 are spaced apart from each other by a first layer of the one or more first layers L1.

In some embodiments, a weight percentage of the organic functional material of the first type (e.g., the host material) in the one or more first layers L1 is in the range of about 40% to about 99% (e.g., 40% to 50%, 50% to 60%, 60% to 70%, 70% to 80%, 80% to 90%, 90% to 95%, or 95% to 100%), and a weight percentage of the organic functional material of the second type (e.g., the guest material) in the one or more first layers L1 is in the range of about 1% to about 60% (e.g., 1% to 5%, 5% to 10%, 10% to 20%, 20% to 30%, 30% to 40%, 40% to 50%, or 50% to 60%). In one example, the weight percentage of the organic functional material of the second type (e.g., the guest material) in the one or more first layers L1 is in the range of about 20% to about 50%.

Referring to FIG. 7, the light emitting diode in some embodiments includes a base substrate BS, an anode AD on the base substrate BS, a hole injection layer HIL on a side of the anode AD away from the base substrate BS, a hole transport layer HTL on a side of the hole injection layer HIL away from the base substrate BS, a light emitting layer EL on a side of the hole transport layer HTL away from the base substrate BS, an electron transport layer ETL on a side of the light emitting layer EL away from the base substrate BS, an electron injection layer EIL on a side of the electron transport layer ETL away from the base substrate BS, and a cathode CD on a side of the electron injection layer EIL away from the base substrate BS.

In some embodiments, referring to FIG. 6 and FIG. 7, any individual first layer of the one or more first layers L1 is spaced apart from the hole transport layer HTL or the hole injection layer HIL by at least one second layer of the one or more second layers L2. Any individual first layer of the one or more first layers L1 is not in direct contact with the hole transport layer HTL or the hole injection layer HIL. This structure avoids any undesirable recombination at an interface between an individual first layer and the hole transport layer HTL.

In some embodiments, referring to FIG. 6 and FIG. 7, any individual first layer of the one or more first layers L1 is spaced apart from the electron transport layer ETL or the electron injection layer EIL by at least one second layer of the one or more second layers L2. Any individual first layer of the one or more first layers L1 is not in direct contact with the electron transport layer ETL or the electron injection layer EIL. This structure avoids any undesirable recombination at an interface between an individual first layer and the electron transport layer ETL.

Figure 8:
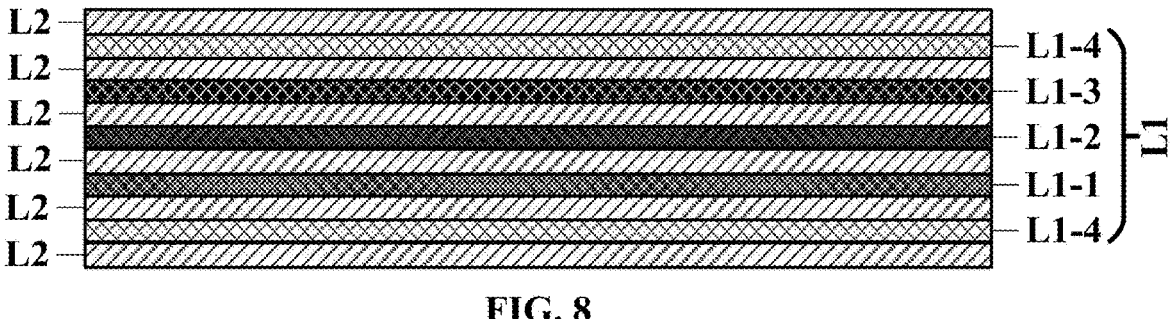
FIG. 8 is a schematic diagram illustrating the structure of a light emitting layer in some embodiments according to the present disclosure.
Figure 9:
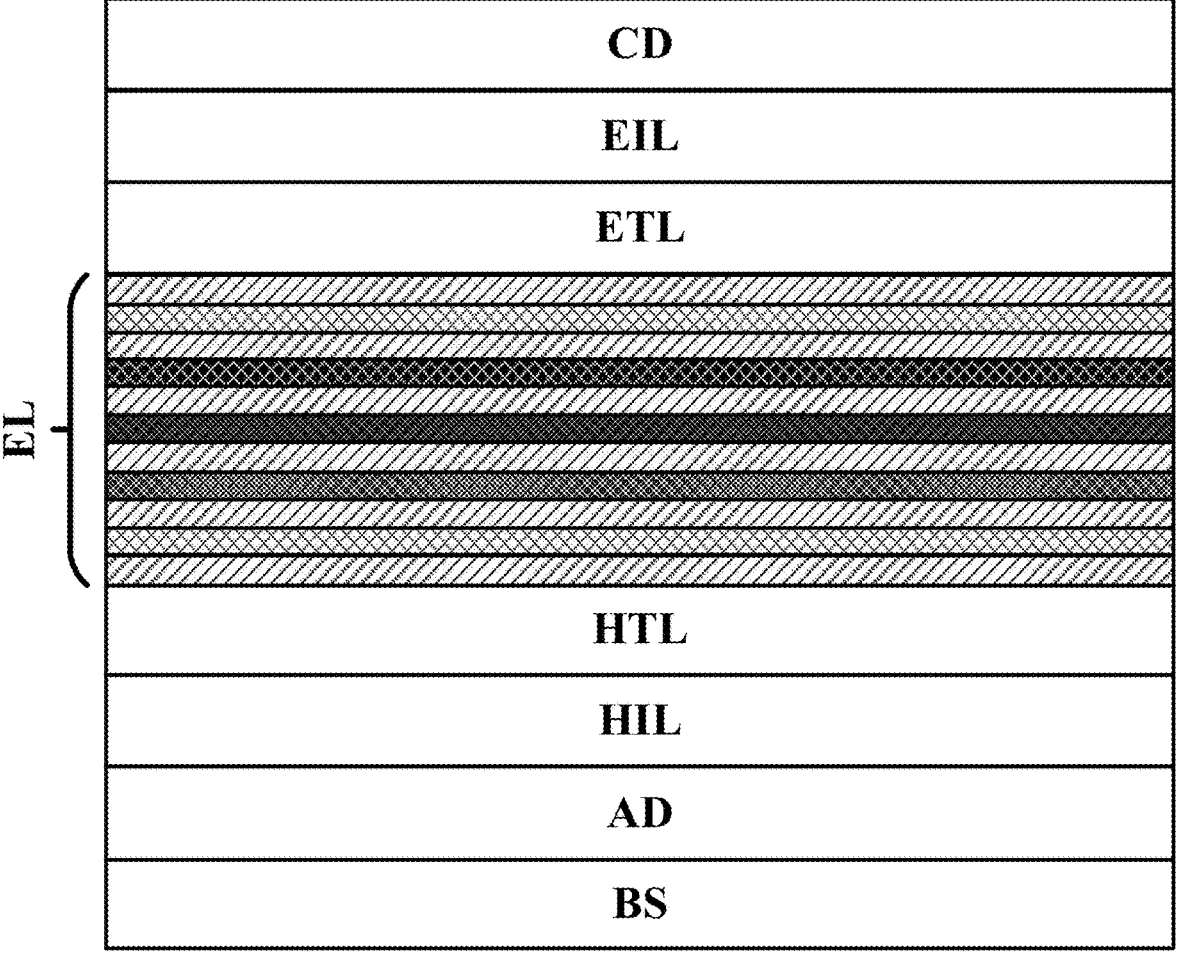
FIG. 9 is a schematic diagram illustrating the structure of a light emitting diode in some embodiments according to the present disclosure.
Figure 10A:
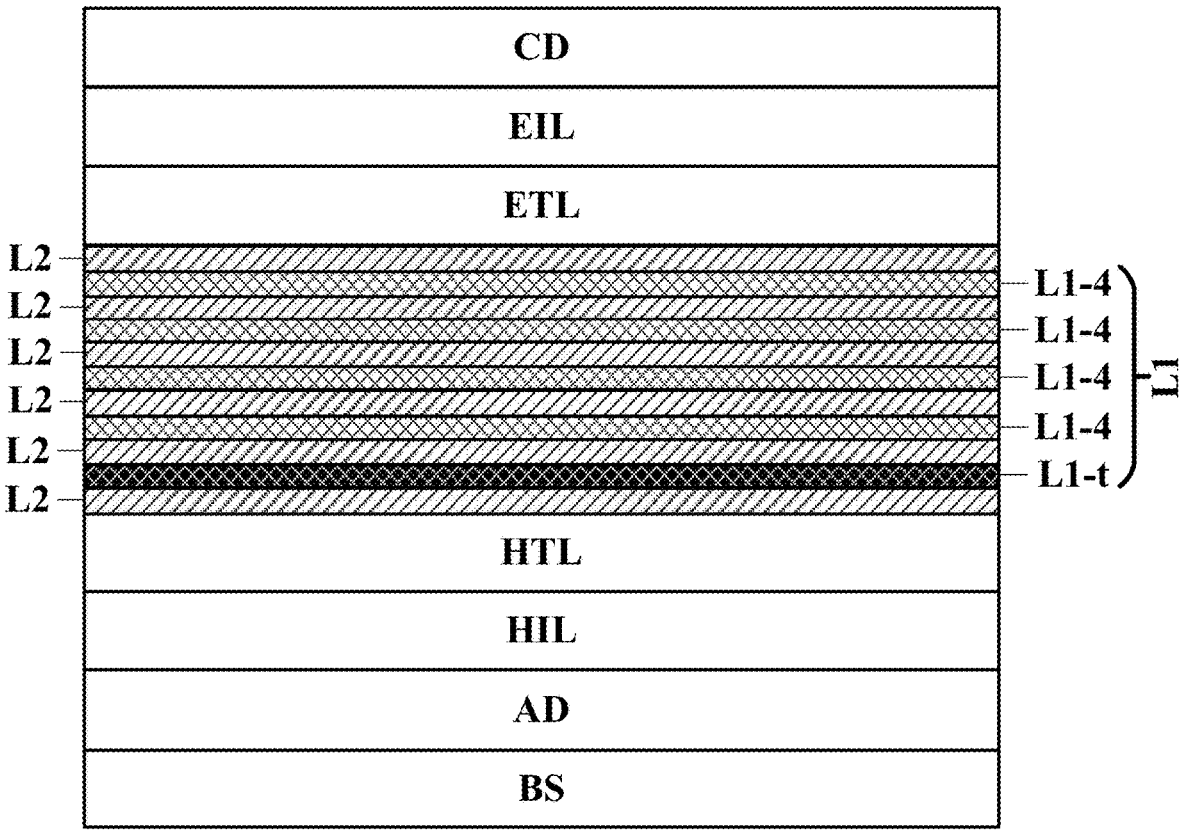
FIG. 10A to FIG. 10E illustrate a process of determining an exciton recombination region in a light emitting layer in some embodiments according to the present disclosure.
Figure 10B:
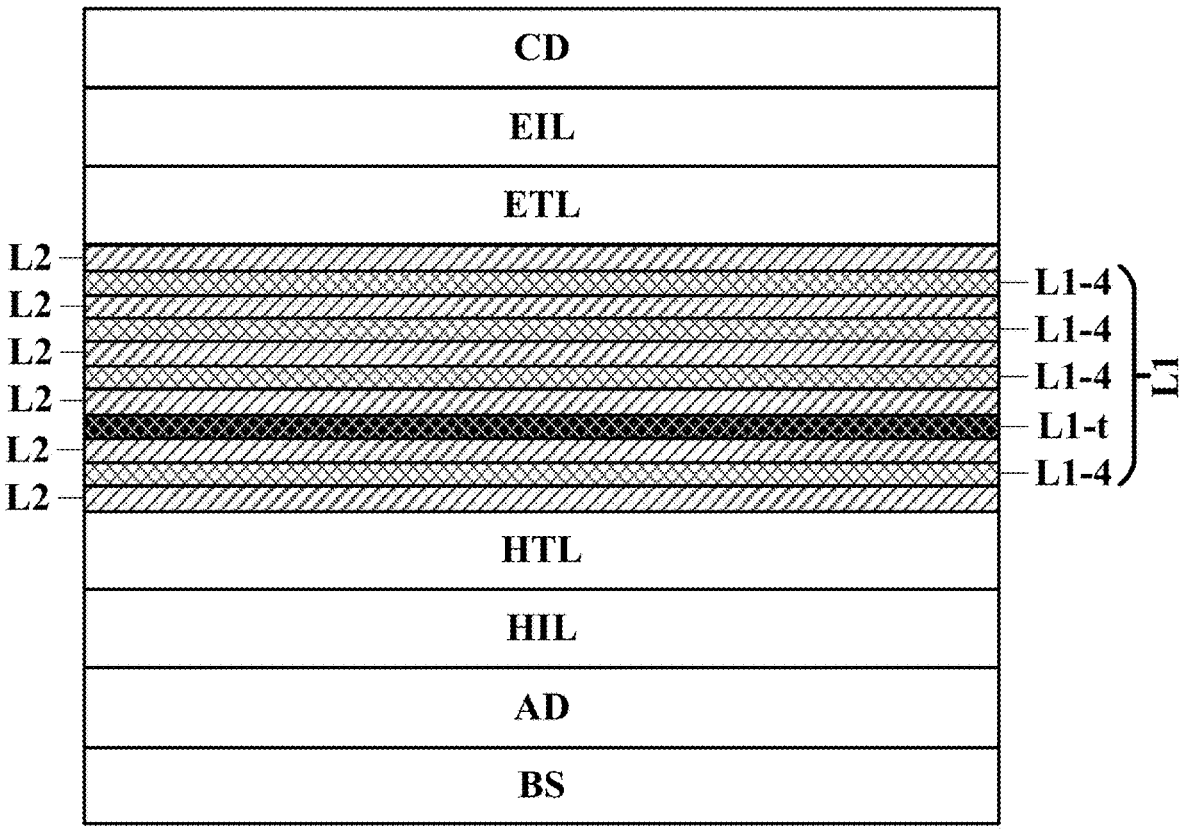
Figure 10C:
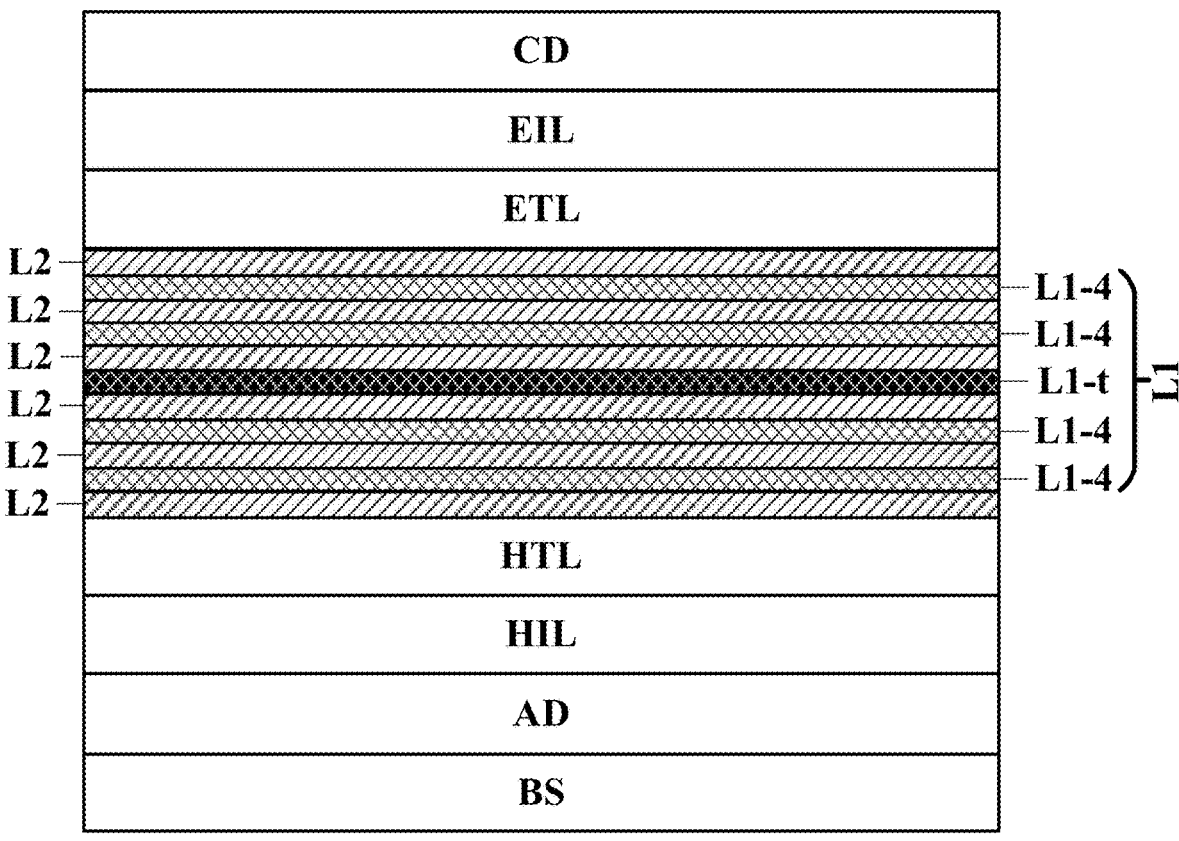
Figure 10D:
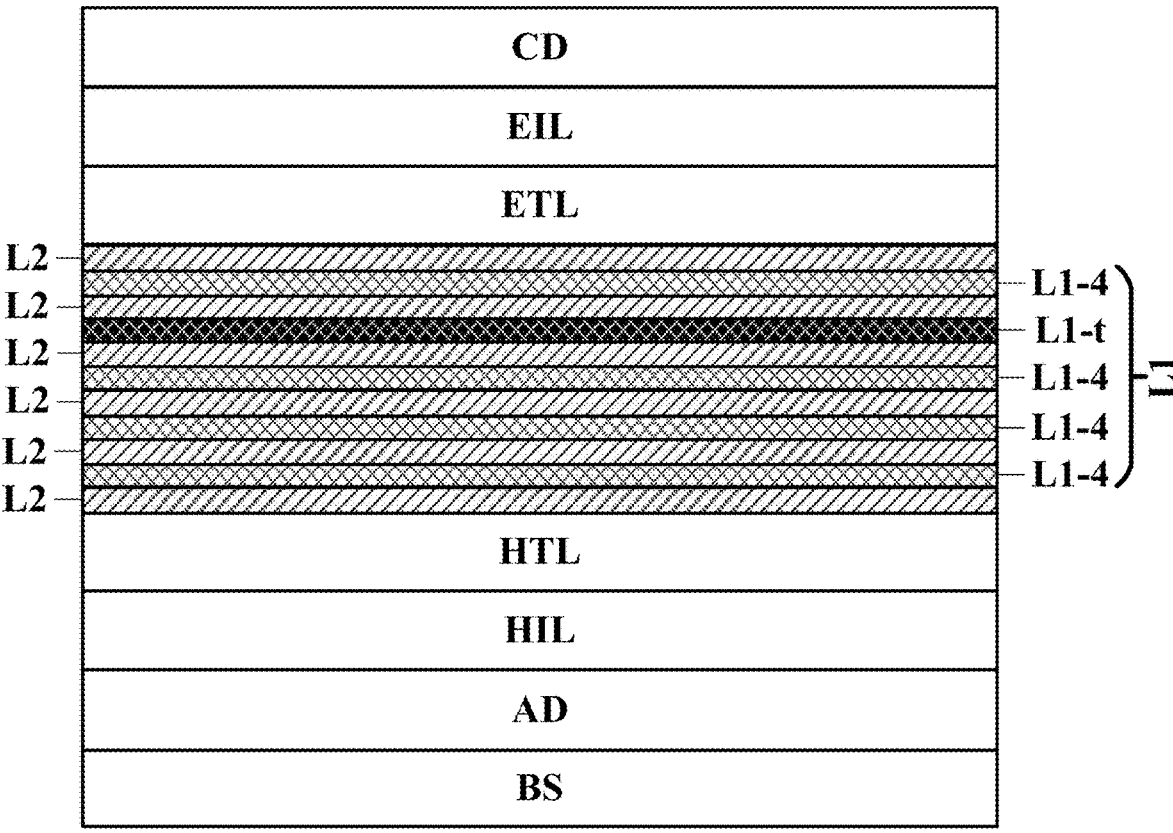
Figure 10E:
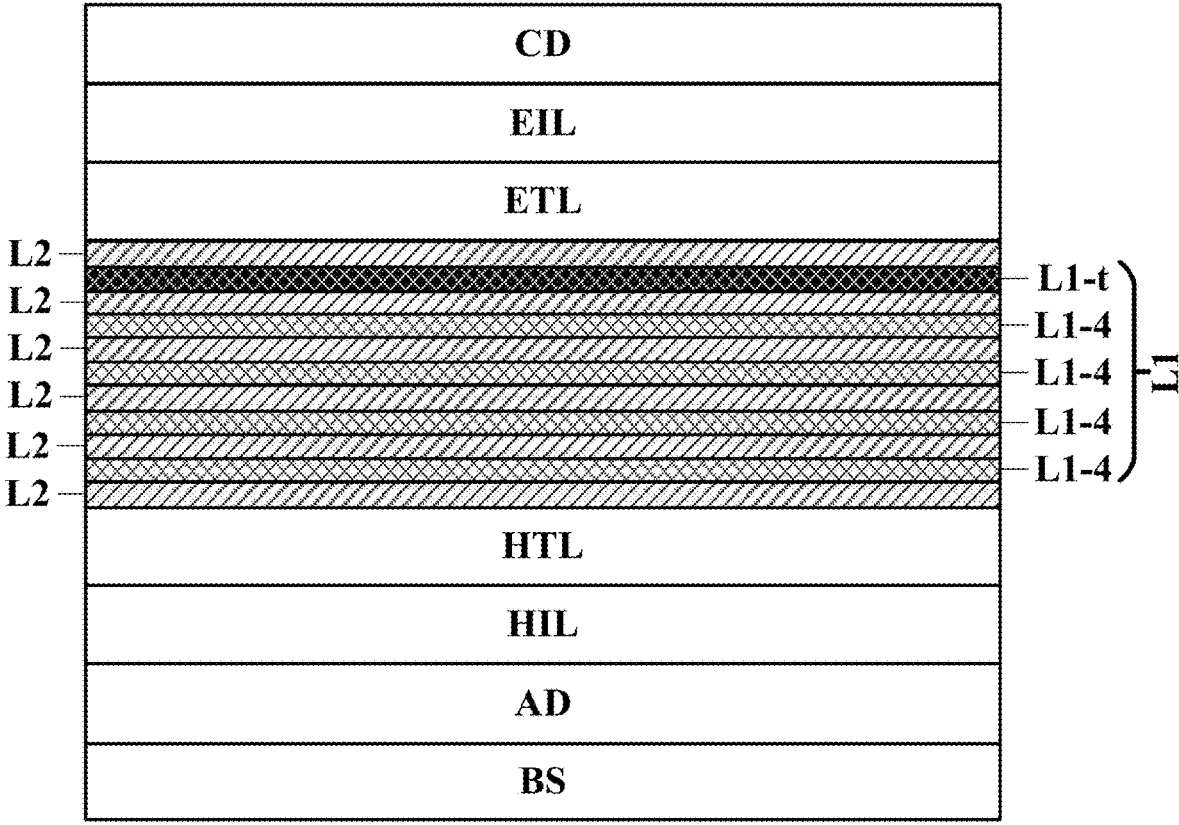

FIG. 8 is a schematic diagram illustrating the structure of a light emitting layer in some embodiments according to the present disclosure. FIG. 9 is a schematic diagram illustrating the structure of a light emitting diode in some embodiments according to the present disclosure. Referring to FIG. 8 and FIG. 9, the light emitting layer in some embodiments includes one or more first layers L1 and one or more second layers L2 stacked together. In some embodiments, a respective first layer of the one or more first layers L1 includes an organic functional material of a first type (e.g., a host material) doped with an organic functional material of a second type (e.g., a guest material), a respective second layer of the one or more second layers L2 includes an organic functional material of the first type without being doped with an organic functional material of the second type, e.g., the organic functional material of the second type is absent in the respective second layer. In one example, the respective first layer includes a host material doped with a guest material, and the respective second layer includes a host material without being doped with a guest material.

In some embodiments, the one or more first layers L1 includes a first respective first layer L1-1, a second respective first layer L1-2, and a third respective first layer L1-3. The first respective first layer L1-1, the second respective first layer L1-2, and the third respective first layer L1-3 are first layers of different colors. For example, the first respective first layer L1-1 is a first layer of a first color, the second respective first layer L1-2 is a first layer of a second color, and the third respective first layer L1-3 is a first layer of a third color. In one example, the first color, the second color, and the third color are three different colors selected from red, green, and blue.

In some embodiments, the one or more first layers L1 further includes one or more fourth respective first layers L1-4. Optionally, the one or more fourth respective first layers L1-4 is at least partially outside an exciton recombination region of the light emitting layer EL. Optionally, the one or more fourth respective first layers L1-4 is completely outside an exciton recombination region of the light emitting layer EL.

In some embodiments, the light emitting layer includes one or more double-layer structure stacked on each other, a respective double-layer structure comprising an individual second layer and an individual first layer stacked on the individual second layer. To illustrate, in one example, the light emitting layer includes (iL2-iL1-1)-(iL2-iL1-2)-(iL2-iL1-3) wherein iL2 stands for an individual second layer of the one or more second layers L2, iL1-1 stands for an individual first respective first layer, iL1-2 stands for an individual second respective first layer, and iL1-3 stands for an individual third respective first layer. Optionally, the light emitting layer includes a first double-layer structure comprising a first individual second layer and the first respective first layer on the first individual second layer, a second double-layer structure comprising a second individual second layer and the second respective first layer on the second individual second layer, and a third double-layer structure comprising a third individual second layer and the third respective first layer on the third individual second layer. Optionally, the third double-layer structure is on a side of the second double-layer structure away from the first double-layer structure. Optionally, the first individual second layer, the second individual second layer, and the third individual second layer are different layers. Optionally, the first respective first layer, the second respective first layer, and the third respective first layer are different layers.

In some embodiments, the light emitting layer includes an initial layer and a last layer, which are two outmost layers on two sides of the light emitting layer. Optionally, the initial layer and the last layer of the light emitting layer are two second layers of the one or more second layers L2. To illustrate, in one example, the light emitting layer includes (iL2-iL1-4)-(iL2-iL1-1)-(iL2-iL1-2)-(iL2-iL1-3)-(iL2-iL1-4)-iL2, wherein iL2 stands for an individual second layer of the one or more second layers L2, iL1-1 stands for an individual first respective first layer, iL1-2 stands for an individual second respective first layer, iL1-3 stands for an individual third respective first layer, and iL1-4 stands for an individual fourth respective first layer. Optionally, the light emitting layer includes a first double-layer structure comprising a first individual second layer and the fourth respective first layer on the first individual second layer, a second double-layer structure comprising a second individual second layer and the first respective first layer on the second individual second layer, a third double-layer structure comprising a third individual second layer and the second respective first layer on the third individual second layer, a fourth double-layer structure comprising a fourth individual second layer and the third respective first layer on the fourth individual second layer, and the last layer. Optionally, the third double-layer structure is on a side of the second double-layer structure away from the first double-layer structure, and the fourth double-layer structure is on a side of the third double-layer structure away from the second double-layer structure.

In some embodiments, two adjacent first layers of the one or more first layers L1 are spaced apart from each other by a second layer of the one or more second layers L2. In some embodiments, two adjacent second layers of the one or more second layers L2 are spaced apart from each other by a first layer of the one or more first layers L1.

In some embodiments, a weight percentage of the organic functional material of the first type (e.g., the host material) in the one or more first layers L1 is in the range of about 40% to about 99% (e.g., 40% to 50%, 50% to 60%, 60% to 70%, 70% to 80%, 80% to 90%, 90% to 95%, or 95% to 100%), and a weight percentage of the organic functional material of the second type (e.g., the guest material) in the one or more first layers L1 is in the range of about 1% to about 60% (e.g., 1% to 5%, 5% to 10%, 10% to 20%, 20% to 30%, 30% to 40%, 40% to 50%, or 50% to 60%). In one example, the weight percentage of the organic functional material of the second type (e.g., the guest material) in the one or more first layers L1 is in the range of about 20% to about 50%.

Referring to FIG. 9, the light emitting diode in some embodiments includes a base substrate BS, an anode AD on the base substrate BS, a hole injection layer HIL on a side of the anode AD away from the base substrate BS, a hole transport layer HTL on a side of the hole injection layer HIL away from the base substrate BS, a light emitting layer EL on a side of the hole transport layer HTL away from the base substrate BS, an electron transport layer ETL on a side of the light emitting layer EL away from the base substrate BS, an electron injection layer EIL on a side of the electron transport layer ETL away from the base substrate BS, and a cathode CD on a side of the electron injection layer EIL away from the base substrate BS.

In some embodiments, referring to FIG. 8 and FIG. 9, any individual first layer of the one or more first layers L1 is spaced apart from the hole transport layer HTL or the hole injection layer HIL by at least one second layer of the one or more second layers L2. Any individual first layer of the one or more first layers L1 is not in direct contact with the hole transport layer HTL or the hole injection layer HIL. This structure avoids any undesirable recombination at an interface between an individual first layer and the hole transport layer HTL.

In some embodiments, referring to FIG. 8 and FIG. 9, any individual first layer of the one or more first layers L1 is spaced apart from the electron transport layer ETL or the electron injection layer EIL by at least one second layer of the one or more second layers L2. Any individual first layer of the one or more first layers L1 is not in direct contact with the electron transport layer ETL or the electron injection layer EIL. This structure avoids any undesirable recombination at an interface between an individual first layer and the electron transport layer ETL.

By having the first respective first layer L1-1, the second respective first layer L1-2, and the third respective first layer L1-3 at least partially in an exciton recombination region of the light emitting layer EL, a white color image display can be achieved. The first respective first layer L1-1, the second respective first layer L1-2, and the third respective first layer L1-3 may have different thicknesses and/or doping percentages, thereby realizing a true white light display.

In some embodiments, the present disclosure further provides a method of determining an exciton recombination region of the light emitting layer. FIG. 10A to FIG. 10E illustrate a process of determining an exciton recombination region in a light emitting layer in some embodiments according to the present disclosure. Referring to FIG. 10A to FIG. 10E, the one or more first layers L1 includes a plurality of fourth respective first layers (a respective fourth respective first layer is denoted as L1-4) and a testing respective first layer L1-t. The testing respective first layer L1-t may be a first layer of a color. For example, the testing respective first layer L1-t may be a first layer that is configured to emit a red light. An emission spectrum is collected for the light emitting diode depicted in FIG. 10A. If a red light emission peak is detected in the emission spectrum, it indicates that the testing respective first layer L1-t is at least partially in the exciton recombination region. If a red light emission peak is not detected in the emission spectrum, it indicates that the testing respective first layer L1-t is at least partially outside the exciton recombination region. In FIG. 10A to FIG. 10E, the testing respective first layer L1-t is at different position of the light emitting diode. In one example, a red light emission peak is not detected in the emission spectrum collected from light emitting diodes depicted in FIG. 10A and FIG. 10E, whereas a red light emission peak is detected in the emission spectrum collected from light emitting diodes depicted in FIG. 10B, FIG. 10C, and FIG. 10D. This indicates that the second, the third, and the fourth layers of the one or more first layers L1 are at least partially in the exciton recombination region of the light emitting diode, and the first and the last of the one or more first layers L1 are at least partially outside the exciton recombination region of the light emitting diode.

Figure 11:
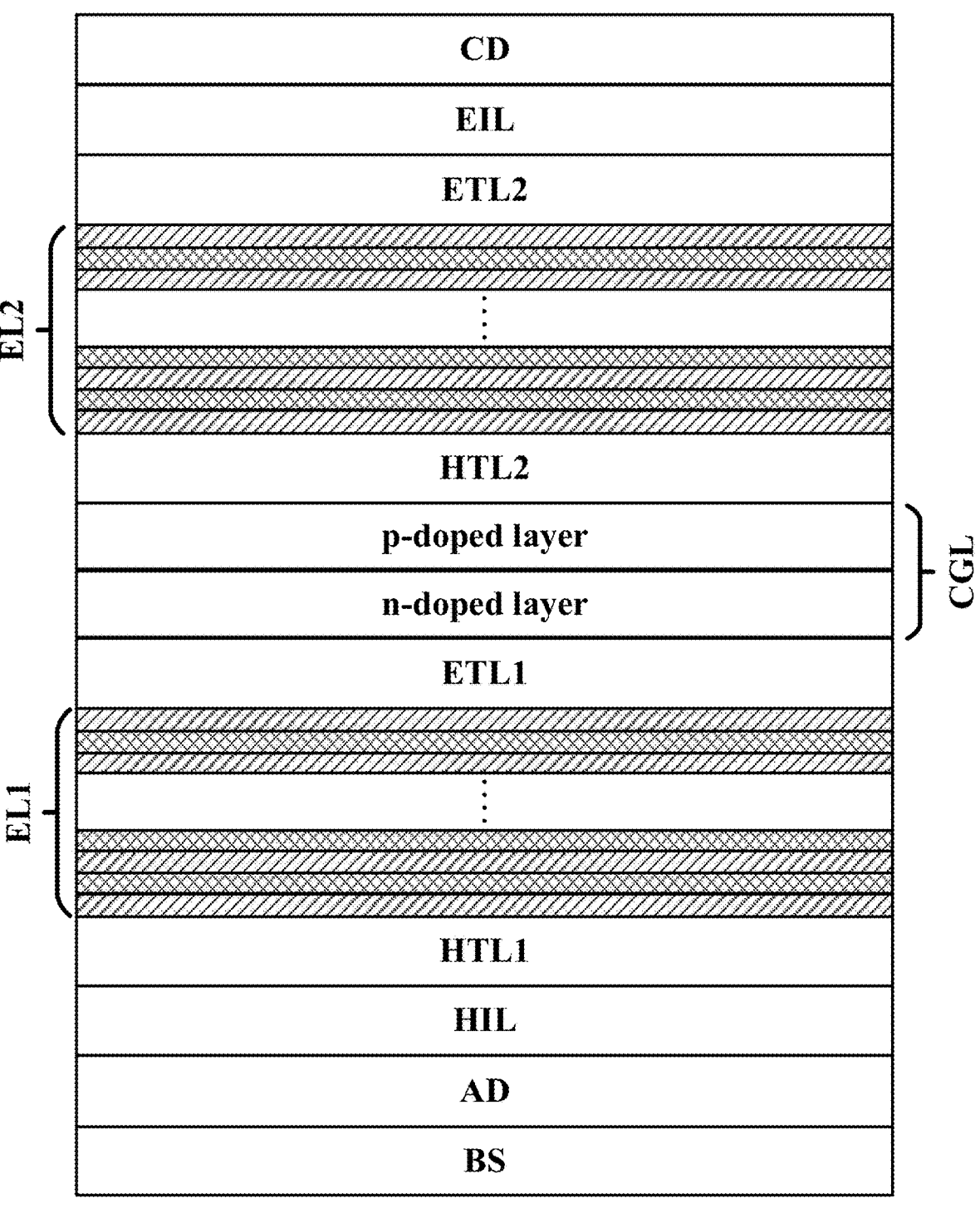
FIG. 11 is a schematic diagram illustrating the structure of a light emitting diode in some embodiments according to the present disclosure.

In some embodiments, the light emitting diode includes a plurality of light emitting layers. FIG. 11 is a schematic diagram illustrating the structure of a light emitting diode in some embodiments according to the present disclosure. Referring to FIG. 11, the light emitting diode in some embodiments is a tandem light emitting diode including a first light emitting layer EL1 and a second light emitting layer EL2 stacked together. The first light emitting layer EL1 may be any of the light emitting layer described in the present disclosure, for example, the light emitting layer depicted in FIG. 2, FIG. 4, FIG. 6, or FIG. 8. The second light emitting layer EL2 may be any of the light emitting layer described in the present disclosure, for example, the light emitting layer depicted in FIG. 2, FIG. 4, FIG. 6, or FIG. 8.

In some embodiments, the light emitting diode includes a base substrate BS, an anode AD on the base substrate BS, a hole injection layer HIL on a side of the anode AD away from the base substrate BS, a first hole transport layer HTL1 on a side of the hole injection layer HIL1 away from the base substrate BS, a first light emitting layer EL1 on a side of the first hole transport layer HTL away from the base substrate BS, a first electron transport layer ETL1 on a side of the first light emitting layer EL1 away from the base substrate BS, a charge generating layer CGL on a side of the first electron transport layer ETL away from the base substrate BS, a second hole transport layer HTL2 on a side of the charge generating layer CGL away from the base substrate BS, a second light emitting layer EL2 on a side of the second hole transport layer HTL2 away from the base substrate BS, a second electron transport layer ETL2 on a side of the second light emitting layer EL2 away from the base substrate BS, an electron injection layer EIL on a side of the second electron transport layer ETL2 away from the base substrate BS, and a cathode CD on a side of the electron injection layer EIL away from the base substrate BS.

In some embodiments, the charge generating layer CGL includes a n-doped layer and a p-doped layer on a side of the n-doped layer away from the base substrate BS. The n-doped layer and the p-doped layer are directly connected to one another, forming a pn junction. In the pn junction, a depletion region is formed, in which electrons of the n-doped layer migrate into the p-doped layer.

The inventors of the present disclosure discover that the n-doped layer typically contains metal elements such as alkaline metal compounds and/or metal. The metal elements are prone to dissipate into the p-doped layer and/or adjacent organic layers, leading to deterioration of the interface and quenching of light emitting molecules. This often results in a lower light emission efficiency and a shorter device life-time.

The inventors of the present disclosure discover that the light emitting layer (e.g., the first light emitting layer EL1 and the second light emitting layer EL2) obviates this issue by having the one or more first layers and the one or more second layers alternately arranged. This unique structure of the present light emitting layer effectively prevents the metal elements from migrating into layers in the exciton recombination region, significantly increasing light emission efficiency and device life-time.

Various appropriate n-doped materials may be used for making the n-doped layer. Various appropriate p-doped materials may be used for making the p-doped layer. The n-doped layer and the p-doped layer may include one or more organic and/or inorganic material(s) as matrix. The matrix is admixed with one or more organic or inorganic dopants to increase the conductivity of the matrix. Examples of dopants for the n-doped layer include metals having a low work function, e.g. Na, Ca, Cs, Li, Mg or compounds thereof e.g. $Cs_2CO_3$, $Cs_3PO_4$, or organic dopants such as NDN-1, NDN-26. Examples of dopants for p-doped layer include transition metal oxides, e.g., $MoO_x$, $WO_x$, $VO_x$, organic compounds, e.g., Cu(I)pFBz, F4-TCNQ, or organic dopants such as NDP-2, NDP-9.

In one example, the n-doped layer include Bepp2:Li. Optionally, the doping percentage of Li is 5%.

In one example, the p-doped layer include NPB:HAT-CN. Optionally, the doping percentage of HAT-CN is 10%.

In another aspect, the present disclosure provides a display substrate including the light emitting diode described herein or fabricated by a method described herein, and a pixel driving circuit configured to drive light emission of the light emitting diode.

Figure 12:
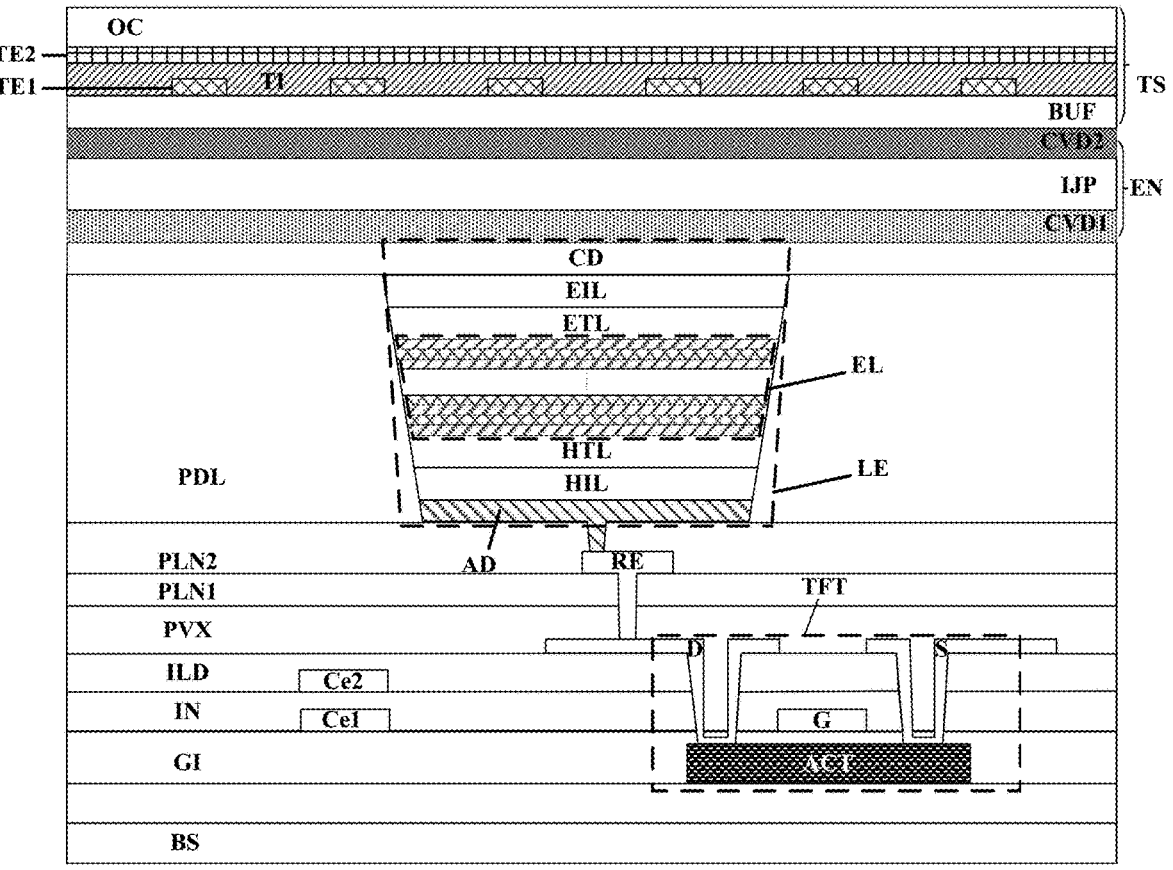
FIG. 12 is a schematic diagram illustrating the structure of a display substrate in some embodiments according to the present disclosure.

FIG. 12 is a schematic diagram illustrating the structure of a display substrate in some embodiments according to the present disclosure. Referring to FIG. 12, the display substrate in some embodiments includes a base substrate BS; an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a relay electrode RE (part of a second SD metal layer) on side of the first planarization layer PLN1 away from the passivation layer PVX; a second planarization layer PLN2 on a side of the relay electrode RE away from the first planarization layer PLN1; a pixel definition layer PDL defining a subpixel aperture and on a side of the second planarization layer PLN2 away from the base substrate BS; and a light emitting diode LE in the subpixel aperture. The light emitting diode LE includes an anode AD on the base substrate BS, a hole injection layer HIL on a side of the anode AD away from the base substrate BS, a hole transport layer HTL on a side of the hole injection layer HIL away from the base substrate BS, a light emitting layer EL on a side of the hole transport layer HTL away from the base substrate BS, an electron transport layer ETL on a side of the light emitting layer EL away from the base substrate BS, an electron injection layer EIL on a side of the electron transport layer ETL away from the base substrate BS, and a cathode CD on a side of the electron injection layer EIL away from the base substrate BS.

The display substrate in the display area further includes an encapsulating layer EN encapsulating the light emitting element LE, and on a side of the cathode CD away from the base substrate BS. The encapsulating layer EN in some embodiments includes a first inorganic encapsulating sub-layer CVD1 on a side of the cathode CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the base substrate BS.

The display substrate in some embodiments further includes a touch structure TS. In some embodiments, the touch structure TS includes a buffer layer BUF on a side of the encapsulating layer EN away from the base substrate BS; a first touch electrode layer TE1 on a side of the buffer layer BUF away from the encapsulating layer EN; a touch insulating layer TI on a side of the first touch electrode layer TE1 away from the buffer layer BUF; a second touch electrode layer TE2 on a side of the touch insulating layer TI away from the buffer layer BUF; and an overcoat layer OC on a side of the second touch electrode layer TE2 away from the touch insulating layer TI.

Figure 13:
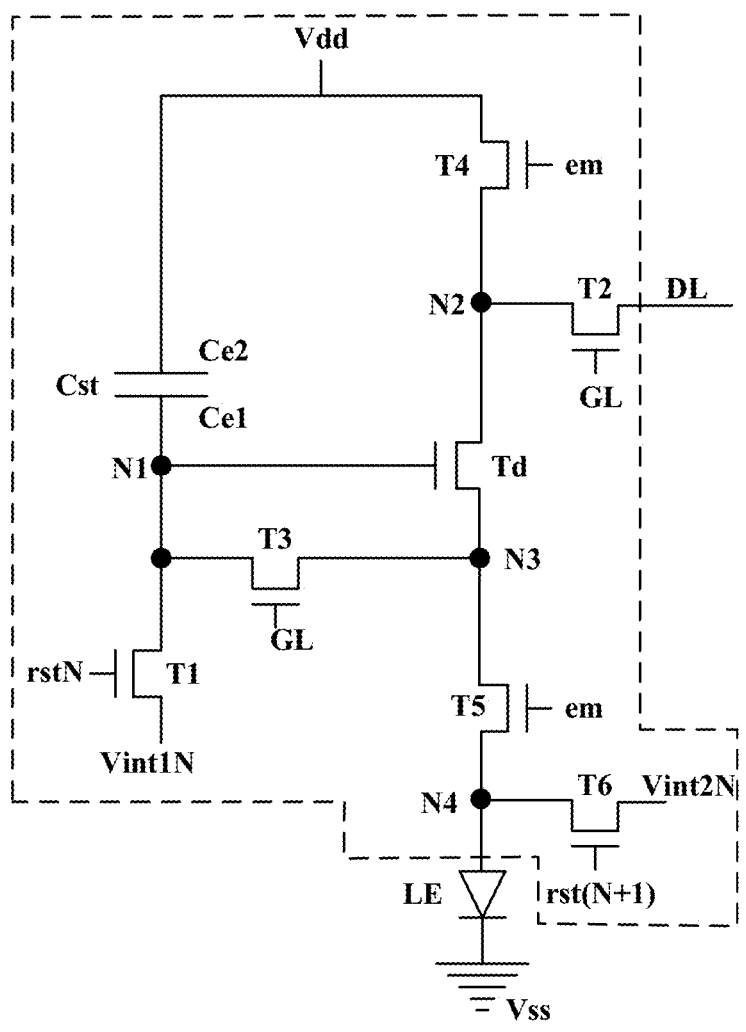
FIG. 13 is a circuit diagram illustrating the structure of a pixel driving circuit in some embodiments according to the present disclosure.

FIG. 13 is a circuit diagram illustrating the structure of a pixel driving circuit in some embodiments according to the present disclosure. Referring to FIG. 13, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage (or a present row) of a plurality of reset control signal lines, a first electrode connected to a respective first reset signal line Vint1N in a present stage (or a present row) of a plurality of first reset signal lines, and a second electrode connected to a first capacitor electrode Ce1 of the storage capacitor Cst and a gate electrode of the driving transistor Td; a second transistor T2 having a gate electrode connected to a respective gate line of a plurality of gate lines GL, a first electrode connected to a respective data line of a plurality of data lines DL, and a second electrode connected to a first electrode of the driving transistor Td; a third transistor T3 having a gate electrode connected to the respective gate line, a first electrode connected to the first capacitor electrode Ce1 of the storage capacitor Cst and the gate electrode of the driving transistor Td, and a second electrode connected to a second electrode of the driving transistor Td; a fourth transistor T4 having a gate electrode connected to a respective light emitting control signal line of a plurality of light emitting control signal lines em, a first electrode connected to a respective voltage supply line of a plurality of voltage supply lines Vdd, and a second electrode connected to the first electrode of the driving transistor Td and the second electrode of the second transistor T2; a fifth transistor T5 having a gate electrode connected to the respective light emitting control signal line, a first electrode connected to second electrodes of the driving transistor Td and the third transistor T3, and a second electrode connected to an anode of a light emitting element LE; and a sixth transistor T6 having a gate electrode connected to a respective reset control signal line rst(N+1) in a next adjacent stage (or a next adjacent row) of a plurality of reset control signal lines, a first electrode connected to a respective second reset signal line Vint2N in the present stage (or the present row) of the plurality of second reset signal lines, and a second electrode connected to the second electrode of the fifth transistor and the anode of the light emitting element LE. The second capacitor electrode Ce2 is connected to the respective voltage supply line and the first electrode of the fourth transistor T4.

In another aspect, the present disclosure provides a display apparatus including the display substrate described herein or fabricated by a method described herein, and one or more integrated circuits connected to the display substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a mini light emitting diode display apparatus. Optionally, the display apparatus is a quantum dots light emitting diode display apparatus.

In another aspect, the present disclosure provides a method of fabricating a light emitting diode. In some embodiments, the method includes forming a light emitting layer. Optionally, forming the light emitting layer includes forming one or more first layers and forming one or more second layers in a stacked structure. Optionally, a respective first layer of the one or more first layers comprises an organic functional material of a first type doped with an organic functional material of a second type. Optionally, a respective second layer of the one or more second layers comprises an organic functional material of the first type without being doped with an organic functional material of the second type. Optionally, forming the light emitting layer includes forming one or more double-layer structure stacked on each other, a respective double-layer structure comprising an individual second layer and an individual first layer stacked on the individual second layer.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting diode, comprising a light emitting layer;
   wherein the light emitting layer comprises one or more first layers and one or more second layers in a stacked structure;
   a respective first layer of the one or more first layers comprises an organic functional material of a first type doped with an organic functional material of a second type;
   a respective second layer of the one or more second layers comprises an organic functional material of the first type without being doped with an organic functional material of the second type;
   wherein the light emitting layer comprises one or more double-layer structure stacked on each other, a respective double-layer structure comprising an individual second layer and an individual first layer stacked on the individual second layer;
   wherein the light emitting layer further comprises one or more third layers;
   wherein the one or more first layers, the one or more second layers, and the one or more third layers are in the stacked structure; and a respective third layer of the one or more third layers comprises an organic functional material of the second type and is absent of the organic functional material of the first type.

2. The light emitting diode of claim 1, wherein the light emitting layer comprises an initial layer and a last layer, which are two outmost layers on two sides of the light emitting layer; and
   the initial layer and the last layer of the light emitting layer are two second layers of the one or more second layers.

3. The light emitting diode of claim 1, wherein two adjacent first layers of the one or more first layers are spaced apart from each other by a second layer of the one or more second layers; and
   two adjacent second layers of the one or more second layers are spaced apart from each other by a first layer of the one or more first layers.

4. The light emitting diode of claim 1, wherein a weight percentage of the organic functional material of the second type in the one or more first layers is in a range of about 20% to about 50%.

5. The light emitting diode of claim 1, further comprising a hole transport layer and an electron transport layer;
   wherein any individual first layer of the one or more first layers is spaced apart from the hole transport layer by at least one second layer of the one or more second layers; and
   any individual first layer of the one or more first layers is spaced apart from the electron transport layer by at least one second layer of the one or more second layers.

6. A display apparatus, comprising the light emitting diode of claim 1, and a pixel driving circuit configured to drive light emission of the light emitting diode.

7. The light emitting diode of claim 6, wherein the respective first layer is in direct contact with the respective second layer on one side, and in direct contact with a respective third layer on the other side; and
   the light emitting layer comprises one or more triple-layer structure in the stacked structure, a respective triple-layer structure of the one or more triple-layer structure comprising an individual second layer, an individual first layer stacked on the individual second layer, and an individual third layer stacked on a side of the individual first layer away from the individual second layer.

8. The light emitting diode of claim 1, wherein two adjacent first layers of the one or more first layers are spaced apart from each other by a second layer of the one or more second layers or a third layer of the one or more third layers; and
   any individual first layer of the one or more first layers spaces apart one second layer of the one or more second layers and one third layer of the one or more third layers.

9. The light emitting diode of claim 1, wherein the one or more second layers comprises at least a first respective second layer and a second respective second layer;
   the first respective second layer comprises a first organic functional material of the first type without being doped with an organic functional material of the second type;
   the second respective second layer comprises a second organic functional material of the first type without being doped with an organic functional material of the second type;

the first organic functional material of the first type and the second organic functional material of the first type are both organic functional materials of the first type; and the first organic functional material of the first type is different from the second organic functional material of the first type.

10. The light emitting diode of claim 9, wherein the first organic functional material of the first type is a p-type organic functional material of the first type; and the second organic functional material of the first type is an n-type organic functional material of the first type.

11. The light emitting diode of claim 9, wherein the second respective second layer is on a side of the first respective second layer away from a hole transport layer; and the first respective second layer is on a side of the second respective second layer away from an electron transport layer.

12. The light emitting diode of claim 1, wherein the one or more first layers comprises at least a first respective first layer and a second respective first layer;

the first respective first layer comprises a first organic functional material of the first type doped with an organic functional material of the second type;

the second respective first layer comprises a second organic functional material of the first type doped with an organic functional material of the second type;

the first organic functional material of the first type and the second organic functional material of the first type are both organic functional materials of the first type; and the first organic functional material of the first type is different from the second organic functional material of the first type.

13. The light emitting diode of claim 12, wherein the first organic functional material of the first type is a p-type organic functional material of the first type; and the second organic functional material of the first type is an n-type organic functional material of the first type.

14. The light emitting diode of claim 12, wherein the second respective first layer is on a side of the first respective first layer away from a hole transport layer; and the first respective first layer is on a side of the second respective first layer away from an electron transport layer.

15. The light emitting diode of claim 1, wherein the one or more first layers comprises a first respective first layer, a second respective first layer, and a third respective first layer;

the first respective first layer is a first layer of a first color;

the second respective first layer is a first layer of a second color;

the third respective first layer is a first layer of a third color; and the first color, the second color, and the third color are three different colors.

16. A light emitting diode, comprising a light emitting layer;

wherein the light emitting layer comprises one or more first layers and one or more second layers in a stacked structure;

a respective first layer of the one or more first layers comprises an organic functional material of a first type doped with an organic functional material of a second type;

a respective second layer of the one or more second layers comprises an organic functional material of the first type without being doped with an organic functional material of the second type;

wherein the light emitting layer comprises one or more double-layer structure stacked on each other, a respective double-layer structure comprising an individual second layer and an individual first layer stacked on the individual second layer;

wherein the one or more first layers comprises a first respective first layer, a second respective first layer, and a third respective first layer;

the first respective first layer is a first layer of a first color;

the second respective first layer is a first layer of a second color;

the third respective first layer is a first layer of a third color; and the first color, the second color, and the third color are three different colors;

wherein the one or more first layers further comprises one or more fourth respective first layers at least partially outside an exciton recombination region of the light emitting layer.

17. The light emitting diode of claim 15, wherein the light emitting layer comprises:

a first double-layer structure comprising a first individual second layer and the first respective first layer on the first individual second layer;

a second double-layer structure comprising a second individual second layer and the second respective first layer on the second individual second layer; and a third double-layer structure comprising a third individual second layer and the third respective first layer on the third individual second layer;

wherein the third double-layer structure is on a side of the second double-layer structure away from the first double-layer structure;

the first individual second layer, the second individual second layer, and the third individual second layer are different layers; and the first respective first layer, the second respective first layer, and the third respective first layer are different layers.

18. A light emitting diode, comprising a light emitting layer;

wherein the light emitting layer comprises one or more first layers and one or more second layers in a stacked structure;

a respective first layer of the one or more first layers comprises an organic functional material of a first type doped with an organic functional material of a second type;

a respective second layer of the one or more second layers comprises an organic functional material of the first type without being doped with an organic functional material of the second type;

wherein the light emitting layer comprises one or more double-layer structure stacked on each other, a respective double-layer structure comprising an individual second layer and an individual first layer stacked on the individual second layer;

wherein the one or more first layers comprises a first respective first layer, a second respective first layer, and a third respective first layer;

the first respective first layer is a first layer of a first color;

the second respective first layer is a first layer of a second color;

the third respective first layer is a first layer of a third color; and the first color, the second color, and the third color are three different colors;

wherein the light emitting layer comprises:

a first double-layer structure comprising a first individual second layer and a fourth respective first layer on the first individual second layer;

a second double-layer structure comprising a second individual second layer and the first respective first layer on the second individual second layer;

a third double-layer structure comprising a third individual second layer and the second respective first layer on the third individual second layer; and a fourth double-layer structure comprising another fourth individual second layer and the third respective first layer on the fourth individual second layer; and a last layer which is one of the one or more second layers;

wherein the third double-layer structure is on a side of the second double-layer structure away from the first double-layer structure, and the fourth double-layer structure is on a side of the third double-layer structure away from the second double-layer structure.

19. The light emitting diode of claim 1, comprising:

a first light emitting layer;

a charge generating layer on the first light emitting layer; and a second light emitting layer on a side of the charge generating layer away from the first light emitting layer;

wherein the charge generating layer comprises a n-doped layer, and a p-doped layer on a side of the n-doped layer away from the first light emitting layer.

* * * * *